(12) United States Patent
Ma et al.

(10) Patent No.: US 10,164,000 B2
(45) Date of Patent: *Dec. 25, 2018

(54) OLED LIGHTING DEVICE WITH SHORT TOLERANT STRUCTURE

(71) Applicant: UNIVERSAL DISPLAY CORPORATION, Ewing, NJ (US)

(72) Inventors: Ruiqing Ma, Morristown, NJ (US); Huiqing Pang, Bellevue, WA (US); Peter Levermore, Lambertville, NJ (US); Prashant Mandlik, Lawrenceville, NJ (US); Jeffrey Silvernail, Yardley, PA (US); Kamala Rajan, Newtown, PA (US); Jason Paynter, Bristol, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/604,748

(22) Filed: May 25, 2017

(65) Prior Publication Data

US 2017/0358632 A1  Dec. 14, 2017

Related U.S. Application Data

(62) Division of application No. 14/939,797, filed on Nov. 12, 2015, now Pat. No. 9,704,942, which is a division
(Continued)

(51) Int. Cl.
*H01L 27/28* (2006.01)
*H01L 27/32* (2006.01)

(52) U.S. Cl.
CPC ........ *H01L 27/329* (2013.01); *H01L 27/3209* (2013.01); *H01L 27/3281* (2013.01);
(Continued)

(58) Field of Classification Search
CPC ..... H01L 27/32; H01L 51/00; H01L 51/5212; H01L 51/5228
(Continued)

(56) References Cited

U.S. PATENT DOCUMENTS

| 4,769,292 A | 9/1988 | Tang et al. |
| 5,247,190 A | 9/1993 | Friend et al. |

(Continued)

FOREIGN PATENT DOCUMENTS

| DE | 102008013031 A1 | 9/2009 |
| EP | 1 460 884 A2 | 9/2004 |

(Continued)

OTHER PUBLICATIONS

Baldo et al.,"Highly efficient phosphorescent emission from organic electroluminescent devices", Nature, vol. 395, pp. 151-154, 1998.
(Continued)

*Primary Examiner* — Tung X Le
(74) *Attorney, Agent, or Firm* — Morris & Kamlay LLP

(57) ABSTRACT

A first device that may include a short tolerant structure, and methods for fabricating embodiments of the first device, are provided. A first device may include a substrate and a plurality of OLED circuit elements disposed on the substrate. Each OLED circuit element may include a fuse that is adapted to open an electrical connection in response to an electrical short in the pixel. Each OLED circuit element may comprise a pixel that may include a first electrode, a second electrode, and an organic electroluminescent (EL) material disposed between the first and the second electrodes. Each of the OLED circuit elements may not be electrically connected in series with any other of the OLED circuit elements.

5 Claims, 25 Drawing Sheets

Related U.S. Application Data of application No. 13/349,295, filed on Jan. 12, 2012, now Pat. No. 9,214,510.

(60) Provisional application No. 61/431,985, filed on Jan. 12, 2011.

(52) U.S. Cl.
CPC ...... *H01L 27/3225* (2013.01); *H01L 27/3288* (2013.01); *H01L 2251/5361* (2013.01)

(58) Field of Classification Search
USPC ...................................... 257/40, 98; 313/504
See application file for complete search history.

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,646,284 B2 | 11/2003 | Yamazaki et al. |
| 6,664,730 B2 | 12/2003 | Weaver |
| 6,870,196 B2 | 3/2005 | Strip |
| 7,034,470 B2 | 4/2006 | Cok et al. |
| 7,279,704 B2 | 10/2007 | Walters et al. |
| 7,368,659 B2 | 5/2008 | Heller |
| 7,431,968 B1 | 10/2008 | Shtein et al. |
| 7,663,300 B2 | 2/2010 | Hack et al. |
| 7,968,146 B2 | 6/2011 | Wagner et al. |
| 7,999,463 B2 | 8/2011 | Nomura |
| 8,100,734 B2 | 1/2012 | Hack et al. |
| 8,203,263 B2 * | 6/2012 | Langguth ............ H01L 51/5203 313/504 |
| 9,214,510 B2 | 12/2015 | Ma et al. |
| 2003/0010985 A1 | 1/2003 | Shen |
| 2003/0230980 A1 | 12/2003 | Forrest et al. |
| 2004/0095300 A1* | 5/2004 | So ........................ G09G 3/3216 345/82 |
| 2004/0099305 A1 | 5/2004 | Heller |
| 2004/0174116 A1 | 9/2004 | Lu et al. |
| 2005/0174064 A1 | 8/2005 | Agostinelli |
| 2005/0258769 A1 | 11/2005 | Imamura |
| 2006/0091794 A1 | 5/2006 | Agostinelli |
| 2009/0009065 A1 | 1/2009 | Nishimura et al. |
| 2009/0045730 A1 | 2/2009 | Nishimura et al. |
| 2009/0146552 A1 | 6/2009 | Spindler et al. |
| 2009/0179554 A1 | 7/2009 | Kuma et al. |
| 2010/0140598 A1* | 6/2010 | Paravia ............... H01L 27/3202 257/40 |

FOREIGN PATENT DOCUMENTS

| | | |
|---|---|---|
| WO | WO-2008057394 A1 | 5/2008 |
| WO | WO-2008064717 A1 | 6/2008 |
| WO | WO-2010011390 A2 | 1/2010 |

OTHER PUBLICATIONS

Baldo et al.,"Very high-efficiency green organic light-emitting devices based on electrophosphorescence", Applied Physics Letters, vol. 75, No. 1, pp. 4-6, Jul. 5, 1999.

Bhattacharyya, D. et al.,"Effect of substrate on the structural and optical properties of chemical-bath-deposited CdS films", Thin Solid Films 288 (1996) 176-181.

Fang, Weileun et al.,"On the thermal expansion coefficients of thin films", Sensors and Actuators 84 (2000) 310-314.

ISA,"International Preliminary Report on Patentability, PCT/US2012/021098", dated Jul. 16, 2013.

ISA,"International Search Report, PCT/US2012/021098", dated Jul. 19, 2012.

ISA,"Written Opinion of the ISA, PCT/US2012/021098", dated Jan. 12, 2012.

Ma, Ruiqing et al.,"OLED Lighting Device with Short Tolerant Structure", U.S. Appl. No. 61/431,985, filed Jan. 12, 2011.

Neerinck, D.G. et al.,"Depth profiling of thin ITO films by grazing incidence X-ray diffraction", Thin Solid Films 278 (1996) 12-17.

Partial International Search issued in PCT/US2012/021098 application.

U.S. Appl. No. 61/431,985, filed on Jan. 12, 2011.

* cited by examiner

FIG. 12(a)
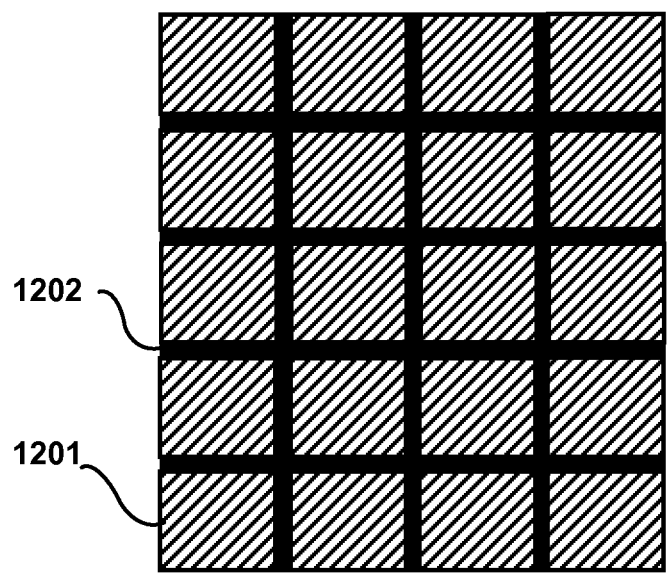
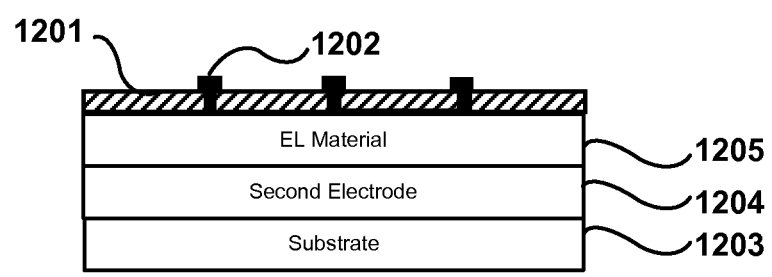
FIG. 12(b)

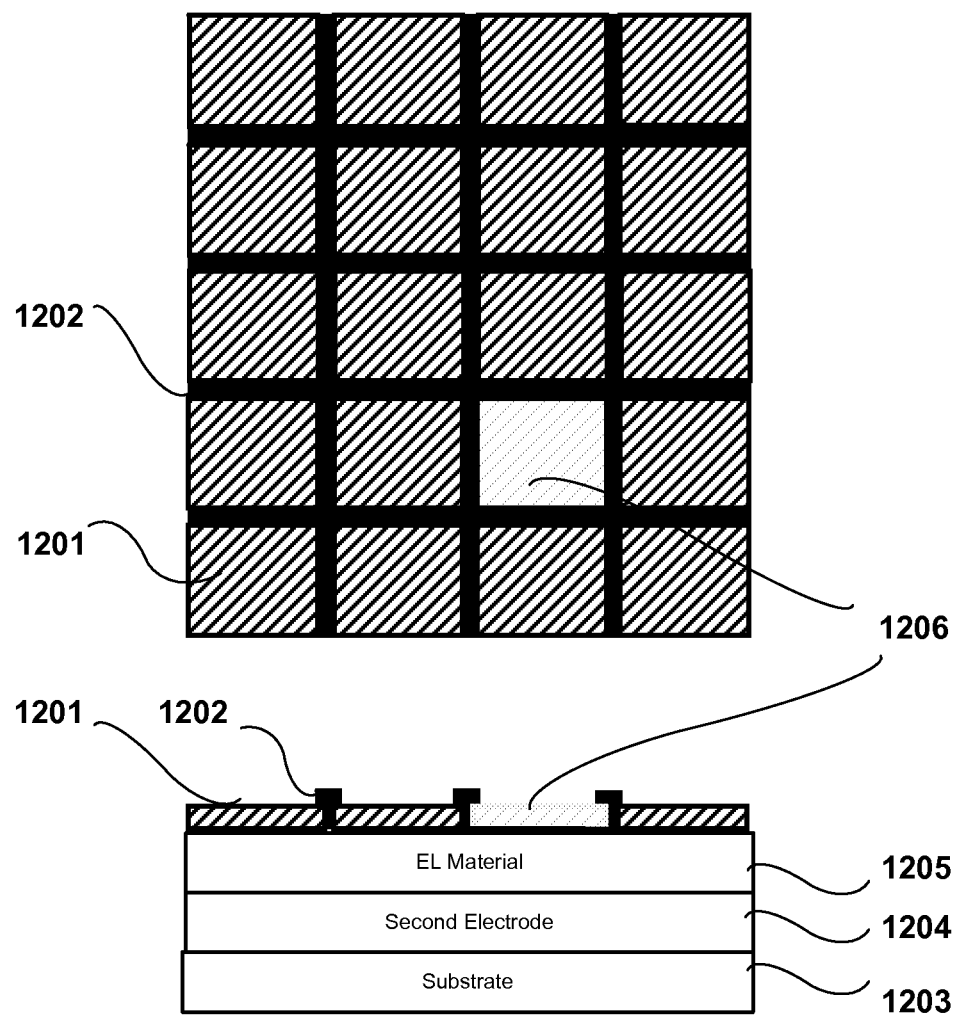

OLED LIGHTING DEVICE WITH SHORT TOLERANT STRUCTURE

CROSS-REFERENCES TO RELATED APPLICATIONS

This application claims benefit under 35 U.S.C. § 119(e) of U.S. provisional patent application No. 61/431,985, filed on Jan. 12, 2011; which is incorporated herein by reference for all purposes and in their entireties.

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to devices having organic light emitting devices, and more particularly to devices having organic light emitting devices that include a short tolerant structure.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris (2-phenylpyridine) iridium, denoted Ir(ppy)3, which has the structure of Formula 1:

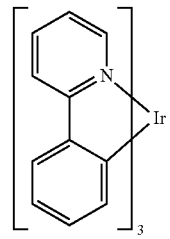

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A first device that may include a short tolerant structure, and methods for fabricating embodiments of the first device, are provided. A first device may include a substrate and a plurality of OLED circuit elements disposed on the substrate. Each of the OLED circuit elements may include one, and only one, pixel. Each OLED circuit element may include a fuse that is adapted to open an electrical connection in response to an electrical short in the pixel. In some embodiments, the OLED circuit elements may include various other components and circuitry in addition to a fuse and the one pixel. Each pixel may include a first electrode, a second electrode, and an organic electroluminescent (EL) material disposed between the first and the second electrodes. Each of the OLED circuit elements may not be electrically connected in series with any other of the OLED circuit elements. In some embodiments, each pixel of the OLED circuit elements may include a top or bottom emission OLED, a stacked organic light emitting device (SOLED), a transparent organic light emitting device (TOLED) or any other variation/combination of OLED devices.

In some embodiments, in the first device as described above, the pixel may have a maximum operating current. In some embodiments, the fuse may be adapted to open in response to a current that is at least 10% greater than the maximum operating current. In some embodiments, the fuse may be adapted to open in response to a current that is at least 50% greater than the maximum operating current. In some embodiments, the fuse may be adapted to open in response to a current that is at least 100% greater than the maximum operating current. In some embodiments, the fuse may be adapted to open in response to a current that is 200% greater than the maximum operating current. In some embodiments, the fuse may be adapted to open in response to a current that is at least 400% greater than the maximum operating current.

Preferably, the pixel of each of the OLED circuit elements may be electrically connected in series with the fuse. According to some embodiments, the first or the second electrode in the pixel of each of the plurality of OLED circuit elements may be the fuse. In some embodiments, the fuse may be ablated in response to an excess current in the pixel.

In some embodiments, the first device may be a lighting panel or a consumer device. In some embodiments, the pixel of each of the plurality of OLED circuit elements of the first device may have a surface area between 0.001 and 5 cm$^2$. The surface area of the pixel may be a measure of a surface area of the first or the second electrode. In some embodiments, the first device may include at least 10 OLED circuit elements. Preferably, the surface area of the pixel of each of the plurality of OLED circuit elements comprises no more than 10% of the surface area of the first device.

In some embodiments, in the first device as described above, the pixel of each of the plurality of OLED circuit elements may have an emissive area that is between approximately 0.001 and 5.0 cm$^2$. In some embodiments, the emissive area of the pixel of each of the plurality of OLED circuit elements may comprise no more than approximately 10% of the emissive area of the first device. In some embodiments, the emissive area of the pixel of each of the plurality of OLED circuit elements may comprise no more than approximately 1% of the emissive area of the first device.

In some embodiments, in the first device as described above, the first electrode of the pixel of each of the plurality of OLED circuit elements may be patterned such that it is physically separate from the first electrode each of the other pixels. In some embodiments, the second electrode of the pixel of each of the plurality of OLED circuit elements may be unpatterned such that the second electrode may be common to a plurality of OLED circuit elements. In some embodiments, the first electrode is an anode and the second electrode is a cathode. In some embodiments, the first electrode is a cathode and the second electrode is an anode.

In some embodiments, the second electrode may be disposed over the substrate, the organic EL material may be disposed over the second electrode, and the first electrode may be patterned and disposed over the organic EL material. In some embodiments, the first electrode may be patterned and may be disposed over the substrate, the organic EL material may be disposed over the first electrode, and the second electrode may be disposed over the organic EL material.

In some embodiments, in the first device as described above where the second electrode is disposed over the substrate, the organic EL material is disposed over the second electrode, and the first electrode is patterned and is disposed over the organic EL material, the first device may further include a plurality of segmented bus lines. The plurality of segmented bus lines may electrically connect the patterned first electrode of each of the plurality of OLED circuit elements together. In some embodiments, the first electrode of each of the plurality of OLED circuit elements is the fuse. In some embodiments, the first electrode of each of the plurality of OLED circuit elements may have a thickness such that the first electrode may be ablated in response to an excess current in the pixel. In some embodiments, the first electrode of each of the plurality of OLED circuit elements may have a thickness between 1 nm and 60 nm. Preferably, the first electrode of each of the plurality of OLED circuit elements may have a sheet resistance between 0.1 Ω/sq. and 500 Ω/sq. In some embodiments, the segmented bus lines may be disposed over the first electrode of each of the plurality of OLED circuit elements. In some embodiments, the first electrode of each of the plurality of OLED circuit elements may be disposed over the segmented bus lines. In some embodiments, the patterned first electrode of each of the plurality of OLED circuit elements may be electrically connected to less than five segmented bus lines. In some embodiments, the segmented bus lines are electrically connected to the first electrode of exactly two of the OLED circuit elements.

In some embodiments, in the first device as described above where the second electrode is disposed over the substrate, the organic EL material is disposed over the second electrode, and the first electrode is patterned and is disposed over the organic EL material, the first device may further include a plurality of segmented bus lines. The plurality of segmented bus lines may electrically connect the patterned first electrode of each of the plurality of OLED circuit elements together. In some embodiments, the first electrode of each of the plurality of OLED circuit elements is the fuse. In some embodiments, the first electrode of each of the plurality of OLED circuit elements may have a thickness such that the first electrode may be open an electrical connection in response to an excess current in the pixel.

In some embodiments, in the first device as described above where the second electrode is disposed over the substrate, the organic EL material is disposed over the second electrode, and the first electrode is patterned and is disposed over the organic EL material, the first electrode may have a first equivalent sheet resistance and the second electrode may have a second sheet equivalent resistance, where the first equivalent sheet resistance and the second equivalent sheet resistance may be within approximately 50%. Preferably, the first equivalent sheet resistance and the second equivalent sheet resistance may be within approximately 10%. In some embodiments, the first sheet resistance and the second sheet resistance are approximately equal. In some embodiments, the first electrode may comprise a material having a first resistivity and the second electrode may comprise a material having a second resistivity, where the first resistivity and the second resistivity may be more than 20% different. In some embodiments, the first resistivity and the second resistivity may be more than 50% different. In some embodiments, the first resistivity and the second resistivity may be more than 100% different.

In some embodiments, in the first device as described above where the second electrode may be disposed over the substrate, the organic EL material may be disposed over the second electrode, and the first electrode may be patterned and is disposed over the organic EL material, the first device may further include a thin layer of conductive material that electrically connects the patterned first electrodes of each of the plurality of OLED circuit elements together. In some embodiments, the patterned first electrode of each of the OLED circuit elements may be a thick layer of conductive material. In some embodiments, the thin layer of conductive material may be the fuse. Preferably, the thick layer of conductive material may have a thickness between 10 am and 500 nm and the thin layer of conductive material may have a thickness between 1 nm and 60 nm. In some embodiments, the thick layer of conductive material may have a thickness that is at least 2 times greater than the thin layer of conductive material. Preferably, each of the OLED circuit elements comprises the thick layer of conductive material and at least a portion of the thin layer of conductive material. In some embodiments, the thin conductive layer may be unpatterned. In some embodiments, the thin layer of conductive material is disposed over the thick layer of conductive material. In some embodiments, the thick layer of conductive material may be disposed over the thin layer of conductive material.

In some embodiments, in the first device as described above where the second electrode is disposed over the substrate, the organic EL material is disposed over the second electrode, and the first electrode is patterned and is disposed over the organic EL material, the first device may further include a top conductive layer and an insulating layer. In some embodiments, for each of the plurality of OLED circuit elements, the insulating layer may be disposed over a part of the first electrode and the top conductive layer may be disposed over the insulator. In some embodiments, the fuse may electrically connect the first electrode of each of the plurality of OLED circuit elements with the top conductor. In some embodiments, the fuse comprises a part of the top conductive layer.

In some embodiments, in the first device as described above where the first electrode may be patterned and disposed over the substrate, the organic EL material may be disposed over the patterned first electrode, and the second electrode may be disposed over the organic EL material, the first device may further include a bus line disposed over the substrate. The patterned first electrode of each of the plurality of OLED circuit elements may be electrically connected to the bus line through at least one of the fuses. In some embodiments, the bus line may be an integrated bus line. In some embodiments, the bus line may comprise a plurality of segmented bus lines. In some embodiments, the patterned first electrode and the fuse of each of the plurality of OLED circuit elements are fabricated in a single step. Preferably, the first device may include an insulating layer. In some embodiments, for each of the plurality of OLED circuit elements, the insulating layer may be disposed between the fuse and the organic EL material. Preferably, the insulating layer may be disposed over the fuses, and the organic EL material may be disposed over the insulating layer. In some embodiments, the insulating layer may form a grid layer over the substrate. Preferably, the fuses have a length-to-width ratio between 0.1 and 5.0. In some embodiments, the insulating layer may form a grid layer over the substrate that defines the emissive area of each OLED circuit element.

In some embodiments, in the first device as described above where the first electrode may be patterned and disposed over the substrate, the organic EL material may be disposed over the patterned first electrode, and the second electrode may be disposed over the organic EL material, the first device may further include a bus line disposed over the substrate. The patterned first electrode of each of the plurality of OLED circuit elements may be electrically connected to the bus line through at least one of the fuses. In some embodiments, the patterned first electrode and the fuse of each of the plurality of OLED circuit elements may be fabricated simultaneously.

In some embodiments, in the first device as described above where the second electrode is disposed over the substrate, the organic EL material is disposed over the second electrode, and the first electrode is patterned and is disposed over the organic EL material, the first device may further include an integrated bus line. The integrated bus line may electrically connect each of the plurality of OLED circuit elements together. In some embodiments, the first electrode of each of the plurality of OLED circuit elements may be the fuse. Preferably, the first electrode of each of the OLED circuit elements may be ablated in response to an excess current flowing through the first electrode. In some embodiments, the integrated bus line may be disposed over the first electrode of each of the plurality of OLED circuit elements. In some embodiments, the bus line may be disposed in-between the plurality of OLED circuit elements.

In some embodiments, in the first device as described above where the second electrode is disposed over the substrate, the organic EL material is disposed over the second electrode, and the first electrode is patterned and is disposed over the organic EL material, the first device may further include an integrated bus line. The integrated bus line may electrically connect each of the plurality of OLED circuit elements together. In some embodiments, the first electrode of each of the plurality of OLED circuit elements may be the fuse. Preferably, the first electrode of each of the OLED circuit elements may open an electrical connection in response to an excess current flowing through the first electrode. In some embodiments, the bus line may at least be disposed in-between the plurality of OLED) circuit elements.

A first method for fabricating an OLED device with a short tolerant structure is also provided. The first method may include obtaining or providing a substrate having a first electrode, depositing an organic EL material over the first electrode, depositing a plurality of physically segmented second electrodes over the organic EL material, and depositing an insulating material over the physically segmented second electrodes, where a portion of each of the second electrodes may remain exposed through the insulating material. The first method may further include depositing an unpatterned blanket layer of a conductive material such that the blanket layer of conductive material may electrically connect to the portion of each of the second electrodes that remains exposed through the insulating material. The electrical connections between the unpatterned blanket layer of conductive material and the exposed portion of each of the plurality of second electrodes may form a fuse.

A second method for fabricating an OLED device with a short tolerant structure is also provided. The second method may include the steps of obtaining or providing a substrate having a first conductive layer disposed thereon, defining a plurality of physically segmented first electrodes on the first conductive layer, and defining a plurality of fuses is on the first conductive layer. The second method may further include fabricating a bus line on the substrate and electrically connecting the plurality of the segmented first electrodes to the bus line through the fuses. In some embodiments, after the step of fabricating the bus line, the second method may further include the step of depositing organic EL material over the first electrodes. In some embodiments, the second method may further include depositing a second electrode over the organic EL material. In some embodiments, the first electrode and the fuses may be defined at the same time. In some embodiments, the first electrode and/or the fuses may be defined using photolithography. In some embodiments, the plurality of first electrodes and the plurality of fuses may comprise the same material. In some embodiments, the plurality of first electrodes and the plurality of fuses are defined simultaneously. In some embodiments, the first conductive layer may comprise a transparent conductive oxide.

In some embodiments, in the second method of fabricating an OLED device with a short tolerant structure as described above, the second method may include depositing an insulting layer over the fuses prior to depositing the organic EL material. Preferably, the insulating layer may be deposited so that the EL material is not damaged when a fuse opens an electrical connection. In some embodiments, the first conductive layer may comprise ITO. In some embodiments, the bus line may be highly conductive. In some embodiments, the first electrodes are anodes. In some embodiments, the bus line may be an integrated bus line or a plurality of segmented bus lines.

In some embodiments, a first device may be provided. The first device may include a substrate and a plurality of OLED circuit elements disposed on the substrate. Each of the OLED circuit elements may include one, and only one, pixel. Each OLED circuit element may include a fuse adapted to open an electrical connection in response to excess current in the pixel. Each pixel may include a first electrode, a second electrode, and an organic electroluminescent (EL) material disposed between the first and the second electrodes. In some embodiments, each of the OLED circuit elements may not be electrically connected in series with any other of the OLED circuit elements.

In some embodiments, in the first device as described above, the plurality of OLED circuit elements may be commonly addressable.

In some embodiments, in the first device as described above, the fuse may comprise substantially the same material as the first electrode. In some embodiments, the fuse may comprise the same material as the first electrode.

In some embodiments, in the first device as described above, the fuse may comprise a transparent conductive oxide. In some embodiments, the fuse comprises ITO.

In some embodiments, in the first device as described above, the fuse and the first electrode may each have a thickness and the thickness of the fuse and the thickness of the first electrode may be approximately the same.

In some embodiments, in the first device as described above, the first electrode may be patterned, the first electrode may be disposed over the substrate, the organic EL material may be disposed over the first electrode, and the second electrode may be disposed over the organic EL material, a bus line may be disposed over the substrate, and the first electrode of each of the plurality of OLED circuit elements may be electrically connected to the bus line through the fuse. In some embodiments, the fuse and the first electrode may each have a thickness and the thickness of the fuse and the thickness of the first electrode may be approximately the same. The bus line may also have a thickness in some embodiments where the thickness of the fuse and the thickness of the bus line may be different. In some embodiments, the fuse may comprise substantially the same material as the first electrode. In some embodiments, the fuse may comprise a different material than the bus line. In some embodiments, the bus line may comprise a material having a first resistivity, the fuse may comprise a material having a second resistivity, where the first resistivity and the second resistivity are different. In some embodiments, the fuse may comprise a transparent conductive oxide. In some embodiments, the fuse may comprise ITO or IZO.

In some embodiments, in the first device as described above, the fuse and the first electrode may be integrally coupled.

In some embodiments, in the first device as described above where the second electrode may be disposed over the substrate, the organic EL material may be disposed over the second electrode, and the first electrode may be patterned and is disposed over the organic EL material, the first electrode of each of the plurality of OLED circuit elements may comprise a first layer of conductive material. The first device may further include a second layer of conductive material that electrically connects the patterned first electrodes of each of the plurality of OLED circuit elements together. In some embodiments, the patterned first electrode of each of the OLED circuit elements may be a thick layer of conductive material. In some embodiments, the first layer of conductive material may have a thickness that is between approximately 5 nm and 1 µm and the second layer of conductive material may have a thickness that is between approximately 1 nm and 60 nm. In some embodiments, the first layer of conductive material may have a thickness that is at least 2 times greater than the second layer of conductive material. In some embodiments, the second layer of conductive material may be the fuse. In some embodiments, each of the plurality of OLED circuit elements may comprise the first layer of conductive material and at least a portion of the second layer of conductive material. In some embodiments, the second layer of conductive material may be unpatterned. In some embodiments, the second layer of conductive material may be disposed over the first layer of conductive material. In some embodiments, the first layer of conductive material may be disposed over the second layer of conductive material.

In some embodiments, a first method may be provided. The first method may include the steps of providing a substrate having a first electrode, depositing organic EL material over the first electrode, patterning a plurality of physically segmented second electrodes over the organic EL material, and depositing insulating material over the physically segmented second electrodes such that a portion of each of the second electrodes remains exposed through the insulating material. In some embodiments, the method may further include the steps of depositing an unpatterned blanket layer of a conductive material such that the blanket layer of conductive material electrically connects to the portion of each of the second electrodes that remains exposed through the insulating material. In some embodiments, the electrical connections between the unpatterned blanket layer of conductive material and the exposed portion of each of the plurality of second electrodes may form a fuse.

BRIEF DESCRIPTION OF THE DRAWINGS

FIG. 3(a) shows a cross-sectional view of an exemplary OLED. FIG. 3(b) shows a top view of the exemplary OLED in normal operation. FIG. 3(c) shows a top view of the exemplary OLED when a fault occurs.

FIGS. 12(a) and (b) show a top view and a cross-section, respectively, of an exemplary OLED before a fault occurs in accordance with some embodiments. FIGS. 12(c) and (d) show a top view and a cross-section, respectively, of the exemplary OLED after a fault occurs in accordance with some embodiments.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence." Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
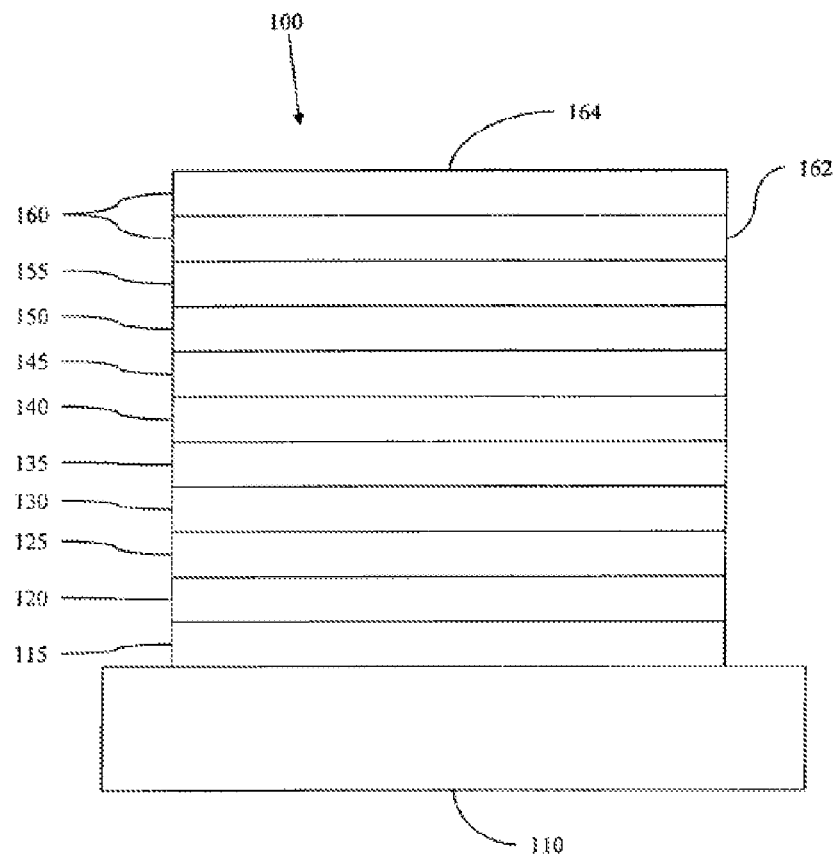
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
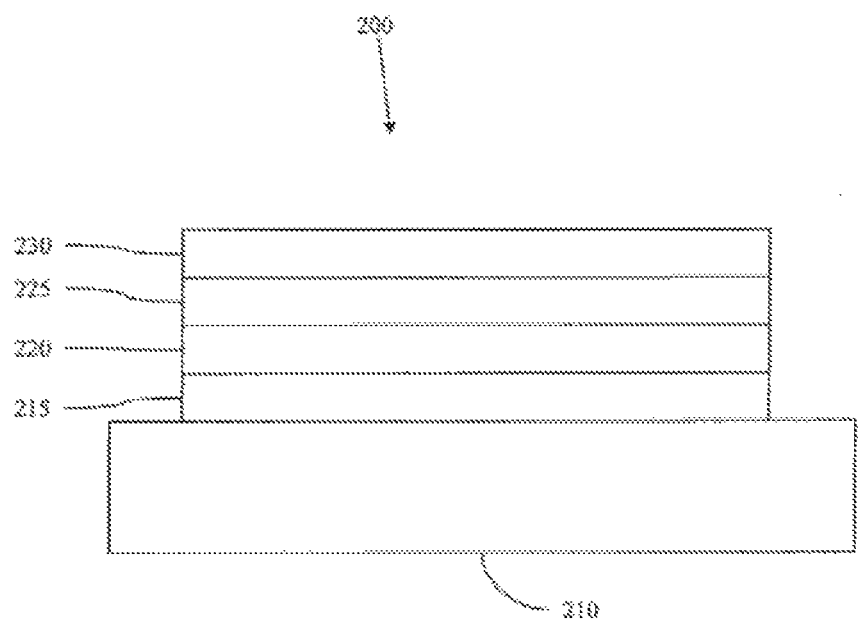
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As used herein, a "fuse" may refer to a component that is electrically conductive under normal operation, but when an excess current flows through the fuse, it generates enough heat to burn the fuse (or otherwise open an electrical circuit). Excess current could be caused by, for example, a current surge from the mains or by the application of excess current from the source. In some instances, excess current could arise from the application of reverse current to the device or could arise upon the occurrence of a short circuit. The above are provided as examples and are not meant to be limiting. In general, there may be various causes of electrical shorts. These include, but are not limited to, locally high electric fields caused by variations in the thickness of the organic stack, conductive spikes on the TCO surface, and/or pinholes in the cathode layer or particulate contamination inside the organic stack, on the electrode surfaces, or arising from conductive bus lines. Electrical shorts may also arise, for instance, because of incomplete coverage of an insulating layer (such as a grid layer), such that there is a local low resistance path between the electrodes. Thus, as used in this context, a fuse may open an electrical connection in response to excess current that may arise from some or all of these causes, or any other cause.

As noted above, a fuse may open an electrical connection or circuit in any suitable manner. For example, a fuse may burn or may otherwise open an electrical circuit such as by melting, ablating, cracking, or undergoing any other chemical or physical change that prevents the flow of current through the fuse. Thus, as may be appreciated by one of skill in the art, there are many possible mechanisms by which a fuse may open an electrical connection in accordance with embodiments disclosed herein.

As used herein, an "excess current" may refer to an amount of current that is greater than the maximum current flowing through a fuse during normal operation, such as the amount of current that occurs in response to a short circuit and/or a reverse current of any magnitude. The amount of current at which point the fuse opens the electrical connection may be referred to as the "melting current" of the fuse. As used herein, the "cross-sectional area" of a fuse may refer to the area of a cross section of the fuse that is substantially perpendicular to the direction of current flow through the fuse.

Although the current at which the fuse opens an electrical connection may be referred to herein as the "melting current," it should be understood that there are many possible mechanisms by which a fuse may open an electrical connection other than melting or ablating the fuse. Some examples of such mechanisms were provided above. Therefore, as would be understood by one of ordinary skill in the art, the "melting current" for a fuse may generally refer to the current at which the fuse opens an electrical connection, regardless of the manner in which this is achieved.

As used herein, the term "approximately" may refer to plus or minus 10 percent, inclusive. Thus, the phrase "approximately 10 µm" may be understood to mean from 9 µm to 11 µm, inclusive.

Figure 3A:
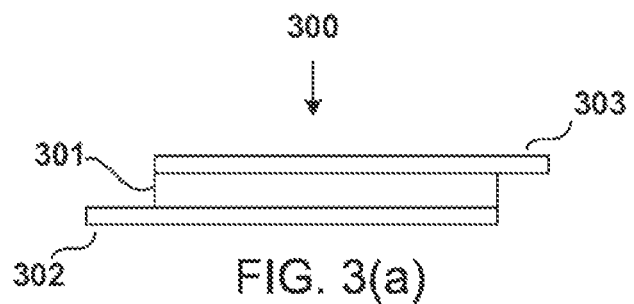
FIGS. 3(a)-(c) show various views of a basic representation of an OLED both in normal operation and when a fault occurs in accordance with some embodiments.

FIG. 3(a) shows a basic depiction of an OLED 300. In general, an OLED may include a light emitting device that utilizes thin films 301 of organic material placed between two electrodes 302 and 303. As noted above, the organic material layers 301 may be very thin (for example, on the order of 100-200 nm), and therefore any rough surface features, embedded particles, or other imperfections may cause the two electrodes 302 and 303 to electrically connect to each other so as to form a short circuit due to the particular imperfection. Once this occurs, most of the current (or a significantly larger portion of the current) that is supplied to the OLED may flow through the shorted location because of its relatively low resistance, thereby leaving little if any current (or a significantly less portion of current) to flow through the rest of the organic layers 301 to generate light. That is, for example, when a short occurs, additional current (i.e. an amount of current that may exceed the maximum current during normal operations) may begin to flow through the portion of the OLED where the short occurs, rather than through other portions of the EL material of the OLED, and thereby reduce the amount of light generated by the device (or by a portion of the device). This may cause the whole device to fail.

The occurrence of a short(s) in a portion of an OLED is typically not a problem for devices such as active-matrix organic light emitting diode (AMOLED) displays where each display pixel may be isolated from the rest of the pixels through complicated circuits. Thus, in these devices, one short may not cause the rest of the display to fail (or to otherwise significantly decrease the amount of current that flows through other portions of the device, which may otherwise decrease the amount of light emitted from the device). However, this type of shorting does present a significant problem for many implementations of OLEDs (such as lighting panels), where there may be a general preference to use simple large-pixel designs (e.g. where the pixels may not be individually addressable) so as to minimize the cost of fabricating the devices (for example, by reducing the number of fabrications steps and/or decrease the number of components and circuitry included in the device). In these and similar applications, one short fault may fail the whole device or may cause enough of the device to fail (or otherwise reduce the amount of light emitted from the device and/or portions thereof) that it would, for practical purposes, render the device unusable for its intended purpose and/or create a noticeably degraded performance.

That is, for example, a short may be more problematic in OLED devices such as passive matrix organic light emitting diode (PMOLED) displays than in AMOLED displays because the lines and columns in the PMOLED may be used to address individual pixels. Therefore, in these devices, a short in one pixel may cause all of the pixels on the same display line to be inoperable, while pixels on other display lines may continue to operate unaffected. Therefore, a short in such a device may create a noticeable decrease in performance because of the multiple pixels on each display line that may be affected by a single short. A short may be most problematic in OLED devices where the pixels may be commonly addressable and not individually addressable. In such devices, one short may affect the performance of all (or substantially all) of the other pixels, and may thereby render such a device unusable or ineffective or its intended purpose.

This short fault problem may be generally described in more detail with further reference to FIG. 3. For purposes of explanation, FIG. 3(a) is described in the context of a simple bottom emission OLED 300. However, it should be understood that the principles and embodiments discussed herein may be equally applicable to any type of OLED, including top emission OLEDs, SOLEDs, TOLEDs, inverted OLEDs, and/or any other combination of organic devices. In the example of a bottom emission OLED, the exemplary device 300 in FIG. 3 may include a transparent anode 302 comprising material such as ITO (or another transparent conductive material) and a cathode 303 comprising a material such as Al. However, as one of ordinary skill in the art would understand, any suitable material may be used for the anode 302 and cathode 303.

Figure 3B:
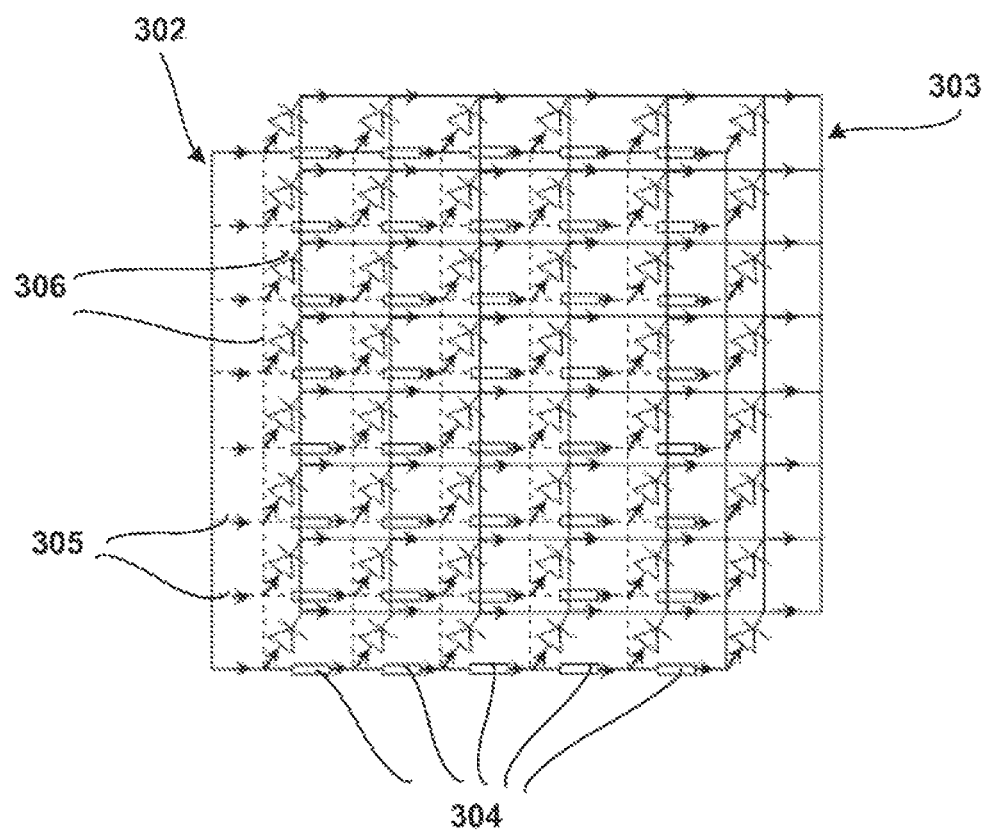

With reference to FIG. 3(b), a top view of an equivalent circuit of an OLED light panel is shown. The arrows 305 indicate the current flow direction of the device (as shown, from the anode 302 to the cathode 303 through the EL layer 301). Continuing with the exemplary embodiment and materials discussed above, the resistance of the Al in the cathode 303 may be very low in comparison to the resistance of the ITO that comprises the anode 302 and therefore will be omitted for purposes of this illustration.

In general, the resistance of ITO should be considered in a large OLED pixel (for example, a pixel having dimensions greater than 2 cm×2 cm). This resistance is represented by resistors 304 in the equivalent circuits in FIGS. 3(b) and (c). For purposes of this example, the ITO resistance in the vertical dimension of the anode 305 is omitted for simplicity. In the configurations shown in FIGS. 3(b) and (c), the current may flow along the ITO anode 302 (to the right in FIG. 3(b)) and through the organic EL material 301 to the cathode plane 303 (in the upward direction in FIG. 3(b)). For purposes of the discussions herein, it may be assumed that the amount of current flowing though each portion of the OLED is relatively uniform when no fault has occurred; however, those of skill in the art would recognize that there may be some variation in the amount of current that flows through different portions of the OILED panel 300 based on, for instance, the sheet resistance of the anode, the distance from the current or voltage source, and/or other imperfections of the device and layers thereof. This non-uniformity may be considered for practical implementations of any device, as would be understood and appreciated by one of ordinary skill in the art.

Figure 3C:
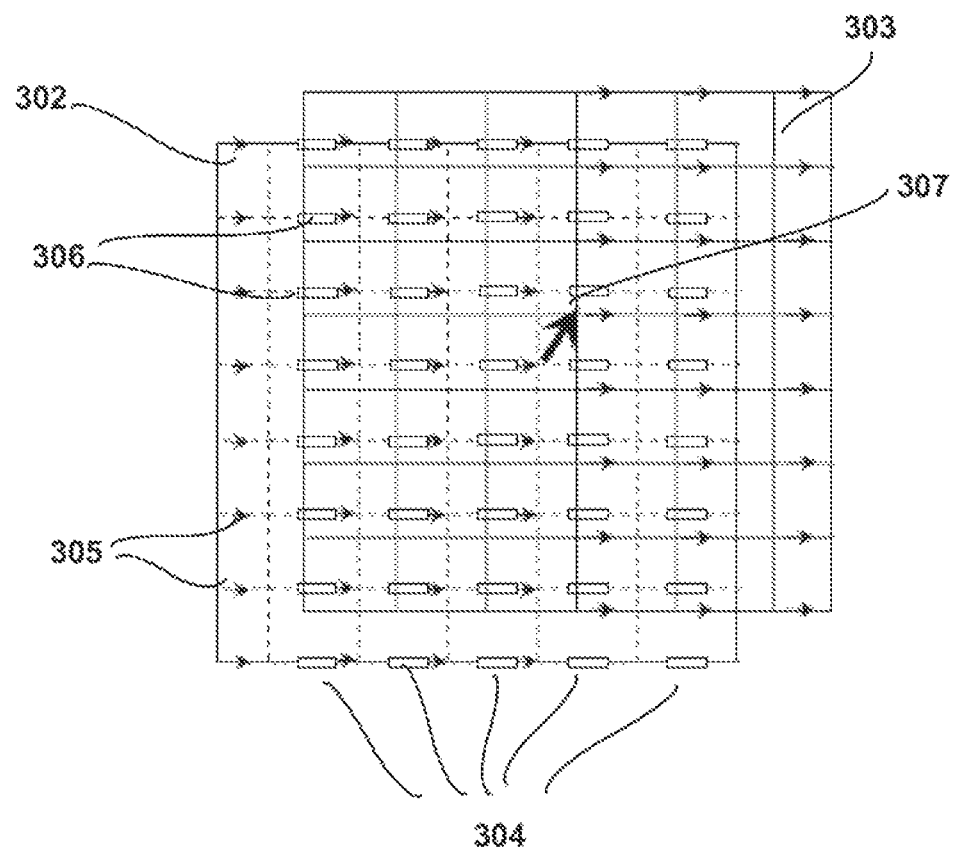
Figure 4A:
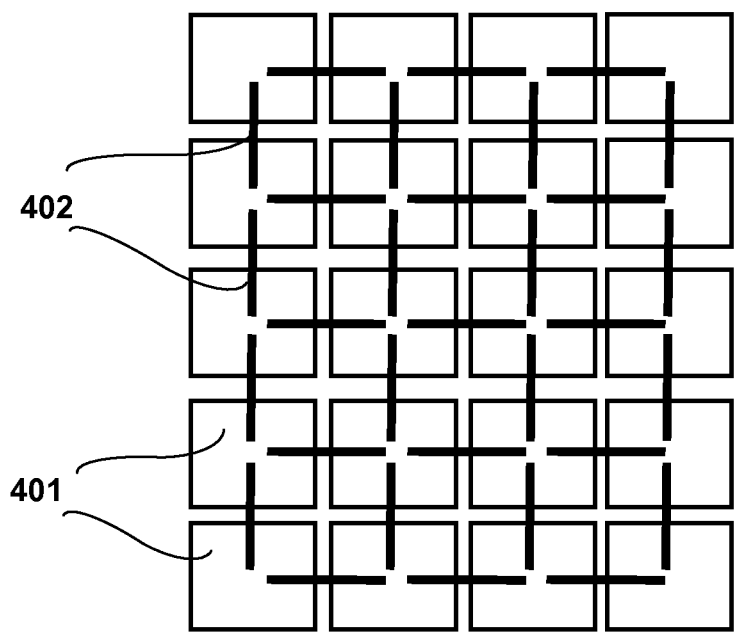
FIGS. 4(a) and (b) show a top view and a cross-section, respectively, of an exemplary OLED comprising segmented bus lines before a fault occurs in accordance with some embodiments.
Figure 4B:
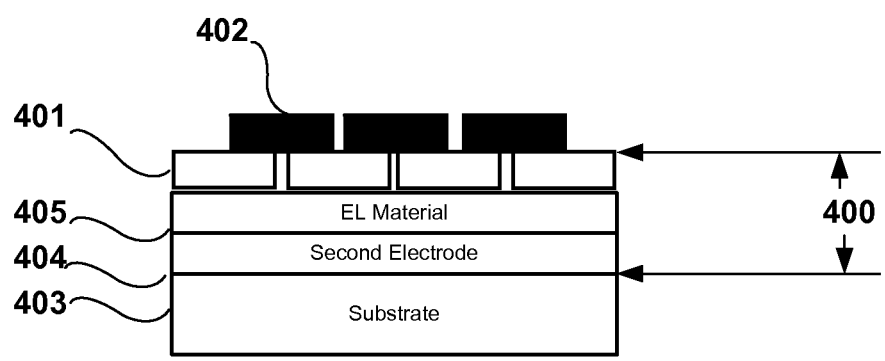
FIGS. 4(c) and (d) show a top view and a cross-section, respectively, of the exemplary OLED comprising segmented bus lines after a fault occurs in accordance with some embodiments.
Figure 4C:
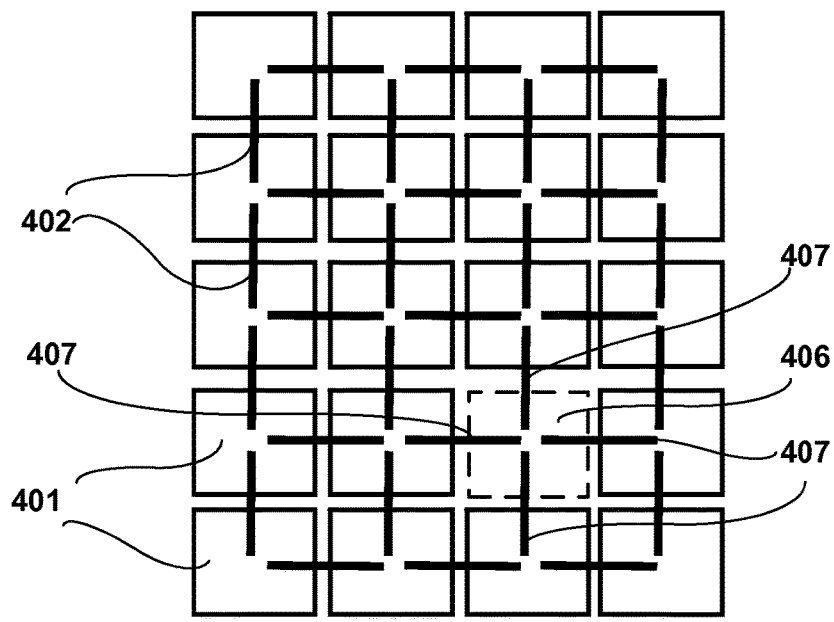
Figure 4D:
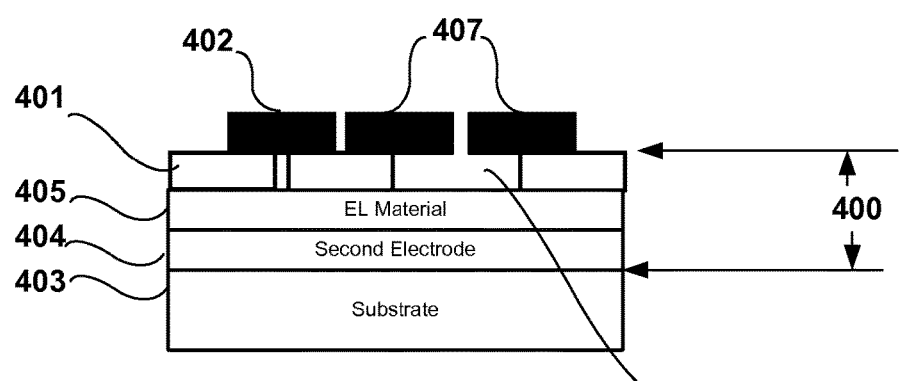

As shown in FIG. 3(b), the exemplary equivalent circuit is shown as comprising an 8×6 matrix of diodes 306 with 8 rows and 6 columns in normal operation. Each diode 306 may represent a separate OLED circuit element. FIG. 3(c) shows a top view of the equivalent circuit of an OLED panel represented by an 8×6 matrix of diodes under a fault condition. When a short occurs, for instance at the position 307, an increased current may flow through the ITO anode 302 to the shorted spot 307, and then continue to the cathode 303, as shown in FIG. 3(c). In this case, no current (or an insufficient amount of current to illuminate the OLED panel to a desired or needed level) may pass through the other OLED circuit elements in the rest of the device and therefore the occurrence of a single short may cause the whole panel to fail, or enough of the device to fail that it would, for practical purposes, be unusable or may have noticeably degraded performance.

One potential solution to this shorting problem contemplated by some of the embodiments disclosed herein is to divide the large size lighting panel into smaller segments (e.g. "pixels"), and then incorporate fuses at each individual pixel. The fuses may be configured so as to open an electrical circuit in response to an excess current, such as when a short circuit occurs. For instance, once a potential short starts drawing a large current, the fuse may open and isolate the shorted pixel from the rest of the panel. Some embodiments may also permit short tolerance for faults that may occur at locations other than within a particular pixel. In some embodiments, the pixels may be designed or configured to be very small so that the shorted region will not noticeably affect the appearance or the function of the whole first device. That is, if a pixel or a small number of pixels are isolated via a fuse because of an excess current, the region of the device affected by these pixels may be small enough such that the OLED may still function for its intended purpose.

The inventors have found that, with regard to some embodiments (such as those used in applications such as lighting devices), the size of the pixels may be designed based on factors and requirements that improve the performance of the device while minimizing or reducing the effects of any shorts that may develop within the device. For example, the size of the pixels may be chosen to increase the brightness uniformity across the device, to improve the overall aesthetics of the device, or may be generally chosen based on fill factor or other manufacturing conditions. This may be in contrast to the selection of pixel size in AMOLED and PMOLED displays, where the size of the pixels is generally pre-determined based on the display resolution. That is, the number of pixels and thereby the size of each of the pixels is generally chosen based on the maximum resolution of the display. Moreover, unlike displays where each pixel may be individually addressed so as to generate an image, the pixels corresponding to some embodiments (such as lighting devices or similar applications) may be electrically connected together such that they are commonly addressable. This may thereby reduce manufacturing costs, the amount and complexity of any addressing circuitry, and/or the overall number of components needed to operate the device. Although the inventors have found that pixelating a lighting device may offer some advantages in some embodiments (including design choices regarding the pixels themselves), it should be appreciated that the features, concepts, and embodiments of the short tolerant structures disclosed herein may also be applicable to display embodiments.

In addition to the short fault problem discussed above, in some embodiments that may include a fuse at each individual pixel level may also be tolerant to excess current in the device, or in the individual pixel, that are caused by other factors. In particular, some embodiments may prevent excess current flow through a pixel that may otherwise damage or affect the performance of the device by opening an electrical circuit in response to the excess current and electrically isolating the pixel. Some examples of such causes of excess current were provided above; however, the fuses in some embodiments may open a circuit in response to any excess current, regardless of its source or cause.

A first device may be provided that includes a short tolerant structure. The first device may include a substrate and a plurality of OLED circuit elements disposed on the substrate. The substrate may contact either the anode or the cathode of the first device. The substrate may be light transmissive (e.g. transparent or semi-transparent) or it may be opaque. For embodiments where the substrate is light transmissive, the substrate may comprise a material such as transparent glass or plastic. However, any material that is light transparent and is suitable for use in an OLED may be used. In some embodiments, the substrate may be opaque and may comprise materials such as glass, plastic, semi-conductor materials, silicon, ceramics, and/or circuit board materials. However, any material that is suitable for OLED devices may be used. Furthermore, the substrate may be rigid or flexible. A flexible substrate may provide for an increase functionality, such as by providing for use in devices that may be disposed in unique locations (e.g. lighting panels around corners or disposed inside containers or other vessels) or that may be more compact and transportable.

As used in this context, each of the "OLED circuit elements" includes one, and only one, pixel. The use of the open-ended claim language "comprising" along with the phrase "one and only one" to describe the pixel means that each OLED circuit element includes only a single pixel, but may include a variety of other items such as fuses, conductors, resistors, etc. As used in this context, a "pixel" may include a first electrode, a second electrode, and an organic electroluminescent (EL) material disposed between the first and the second electrodes. The pixel of each of the OLED circuit elements may include a bottom or top emission organic light emitting diode, a stacked organic light emitting diode (SOLED), a transparent organic light emitting diode (TOLED)), an inverted organic light emitting diode, and/or any other variation/combination of OLED. In general, each pixel may have at least one of either the first electrode, second electrode, and/or an organic layer that has been patterned such that the patterned elements are not common or shared with any other pixel. The patterned component of a pixel may be either the first electrode or the second electrode. The pixel of each of the OLED circuit elements may correspond to the active area of the device from which light is emitted. In some embodiments (examples of which are described herein), in the first device as described above, a short in one pixel may not prevent the other pixels of the device from functioning properly—or from enabling the first device to continue to perform its intended function.

As would be appreciated by one of skill in the art, the patterned electrode of each pixel may be physically segmented from the corresponding patterned electrode of each of the other pixels, but this may not necessarily mean that each pixel is physically isolated (i.e. that each pixel comprises a separate electrical "island"). That is, for example, in some embodiments, a fuse that connects to a patterned electrode may also connect to a common bus line or may otherwise "physically connect" two patterned electrodes together (either directly or via other components of the device). In general, as would be understood by one of ordinary skill in the art, reference to "physical separation" or "physical segmentation" of the electrode of each pixel may refer to when the electrodes are pixilated such that if a fuse opens an electrical circuit corresponding to the electrode, current will no longer flow through the pixel that includes that particular electrode, but current may still through the other pixels of the device.

The OLED circuit elements may also include a fuse. The fuse or fuses of the OLED circuit elements may be adapted to open an electrical connection in response to an excess current in the pixel (or an excess current in a portion of the device that is near the pixel). A fuse may be configured to operate according to any suitable method including, but not limited to, ablation of the fuse in response to a short circuit. If an excess current occurs in one of the OLED circuit elements, the increased current through the OLED circuit element may cause the fuse to open the circuit, thereby converting the short failure to an open failure. In this manner, in some embodiments, the OLED circuit element may thereby be electrically isolated from the other components of the first device. In some embodiments, each of the OLED circuit elements may not be electrically connected in series with any other of the OLED circuit elements. In this manner, when an OLED circuit element fails open (i.e. when a fuse isolates the OLED circuit element or components thereof), current still flows to the other OLED circuit elements in the first device.

As would be understood by a person of ordinary skill in the art, other suitable methods for a fuse to operate may include, by way of example only, melting, burning, ablating, cracking or chemical or physical modification of fuse in response to a short circuit.

The parameters of a fuse that may be used in embodiments disclosed herein, such as materials and dimensions, may be readily selected by one of skill in the art to accommodate a desired normal operating current, melting current, and short circuit current. An example of this is discussed below. As used herein, a "short circuit current" may refer to the current that flows through a device when a short circuit occurs in the absence of a fuse. As used herein, the "melting current" may refer to the minimum current at which the fuse is designed to open, and is preferably less than the short circuit current but greater than the maximum operating current. A person of ordinary skill in the art would know how to select parameters of the fuse to accommodate desired or designed maximum operating current, minimum short circuit current, and melting current. An example of this is described below with reference to FIG. 21. In general, the properties of the fuse should be such that the fuse is electrically conductive under normal operation, but when an excess current begins to flow through (or near) the OLED circuit element, the excess current passing through the fuse generates enough heat to burn or ablate the fuse (or otherwise cause the fuse to open) and thereby open the electrical connection.

In some embodiments, a particular dimension or dimensions of the fuse may have a greater or lesser effect on the amount of current that may pass through the fuse without the fuse opening the electrical connection. For example, in embodiments where the fuse comprises a portion of a blanket thin layer or when an electrode of an OLED circuit element comprises the fuse. The "thickness" of the fuse in such embodiments may be a factor that determines the amount of current that will open the circuit (i.e. it may be a factor in establishing the melting current of the fuse). Examples of such embodiments are illustrated in FIGS. 4, 5, and 12 and described with respect to the "exemplary embodiments" identified below as embodiments 1, 2, and 5.

In some embodiments, the cross-sectional area may be a significant factor that determines the amount of current that will open the circuit (i.e. the melting current of the fuse).

Figure 6A:
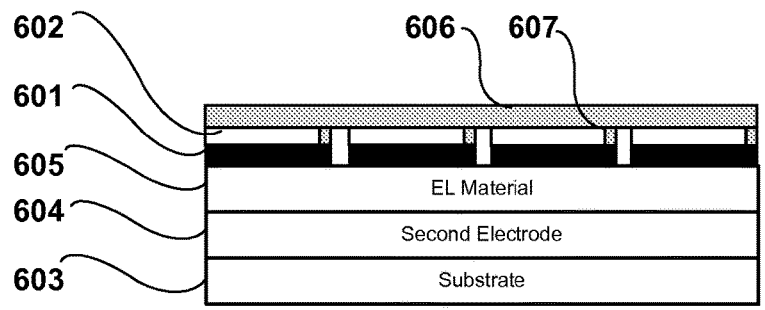
FIG. 6(a) shows a cross-sectional view of an exemplary OLED before a fault occurs in accordance with some embodiments.
Figure 6B:
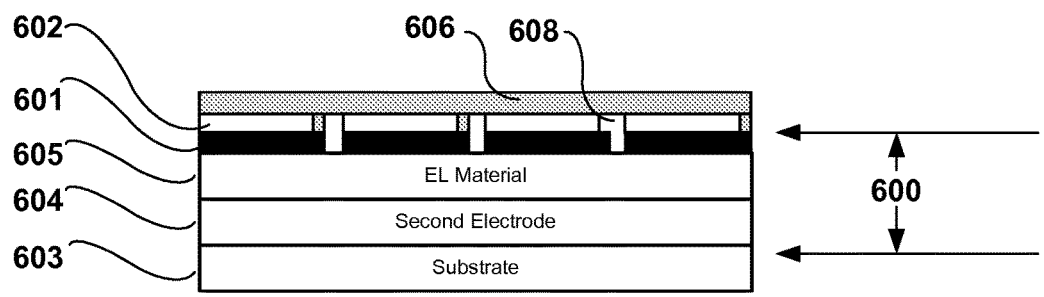
FIG. 6(b) shows a cross-sectional view of the exemplary OLED after a fault occurs in accordance with some embodiments.
Figures 7A, 7B:
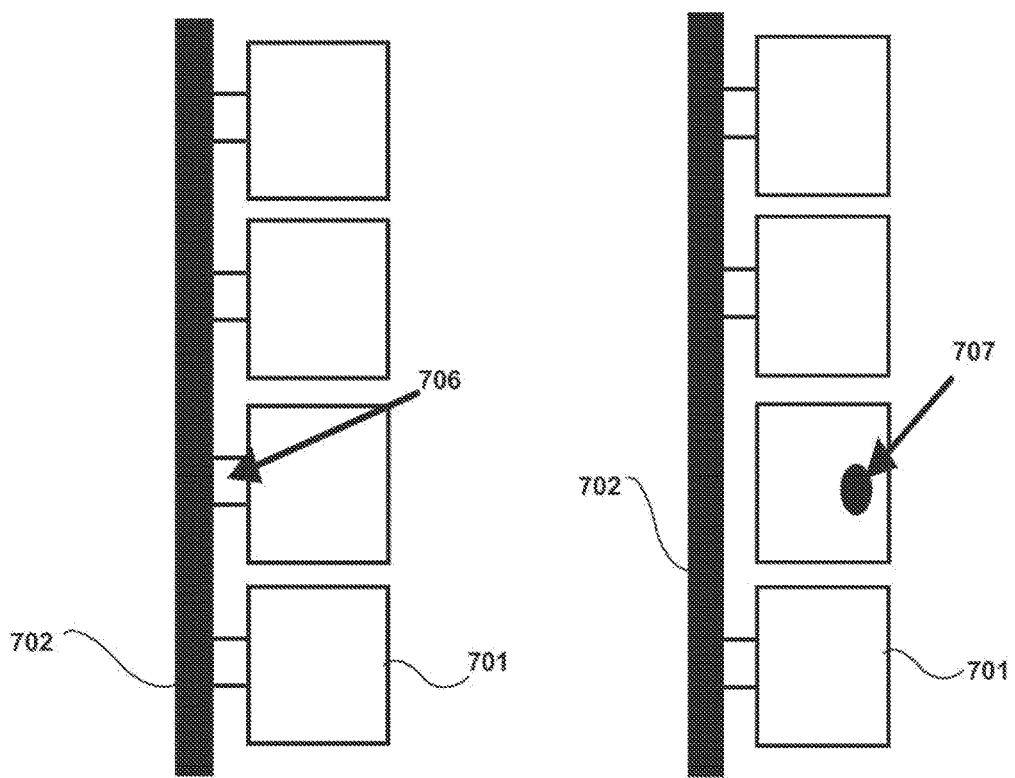
FIGS. 7(a) and 7(b) show an exemplary OLED before and after a short fault occurs, respectively, in accordance with some embodiments.

Examples of such embodiments are illustrated in FIGS. 6 and 7 and described with respect to the identified "exemplary embodiments" 3 and 4 below.

In general, a more conductive (less resistive) material may act as a fuse for given current levels at smaller dimensions than a less conductive material. This may be due, in part, to the decrease in resistivity of the more conductive material, where the heat generated by a current passing through the fuse is based at least in part on the resistivity of the material of the fuse (i.e. the joule heating in the fuse is proportional to the amount of square of the current (1) times the resistance of the fuse (R)). Any material and any dimensions of a fuse are contemplated herein so long as the component functions properly as a fuse in the OLED.

As noted above, one of skill in the art may readily select parameters of the fuse (such as the materials and dimensions of the fuse) based on the normal operating current and the expected or predicted short circuit current so as to provide a fuse having melting current such that the fuse is designed to open the electrical connection at a desired current in relation to the maximum operating current. Preferably, the melting current of the fuse may be greater than the normal operating current, and preferably less than or equal to the short circuit current. By designing the fuse to conduct electricity at (and preferably slightly above) the normal operating current, but below the short circuit current, embodiments may provide for a device that operates normally when a short does not occur but will isolate a portion of the device if a short occurs (or begins to occur).

As would be appreciated by one of skill in the art, for a device that may have multiple normal operating currents (such as a dimmable device), the "normal operating current" that may be used to determine the design parameters of the fuse may correspond to the maximum operating current of the device. In this manner, a fuse may be designed such that it will not open when the device is operating at the highest brightness level of the device.

As noted above, some embodiments may comprise a plurality of pixels each comprising a fuse. If one of the fuses is opened, then in some instances, there may be an increase in current that flows through the other OLED circuit elements during normal operation. Therefore, it may be preferred, in some embodiments, that the fuse has a melting current that takes this increase current during normal operation into consideration. However, if the fuse has a melting current that is set above the short circuit current, when a short occurs, the fuse may not open and thereby the device may be rendered inoperable. Depending upon the specific application of the device, it may be desirable to have a highly sensitive fuse that opens in response to a current that is only slightly higher than the maximum operating current, or it may be desirable to have a less sensitive fuse that allows a significant excess current to flow prior to opening the fuse. For example, it may be preferred that the fuse opens in response to an excess current that is 10%, 50%, 100%, 200%, or even 400% greater than the maximum operating current. Where there is a range of operating currents (for example, such that the luminance of the OLED light panel may be controlled), the melting current of the fuse should be greater than the maximum operating current (i.e. the current that is provided when the device is operating at its highest current at which the device is designed to operate). The melting current of the fuse may also be designed to be less than the minimum short circuit current (i.e. the current that is provided when there is an electrical short when the device is operating at its lowest current at which the device is designed to operate).

In some embodiments, the OLED circuit elements may include various other components and circuitry in addition to a fuse and the one pixel. For instance, an OLED circuit element may contain additional resistors, capacitors, inductors, voltage/current metering devices, voltage/current sources, diodes, transistors, and/or additional fuses. However, as used herein and noted above, an "OLED circuit element" includes only one pixel. Additional circuit components not listed may also be included. Furthermore, a plurality of OLED circuit elements may share a common circuit component. For instance, in some embodiments multiple OLED circuit elements may share a common unpatterned layer such as an unpatterned electrode or organic layer. Additionally, in some embodiments, a portion of the fuse of an OLED circuit element may also comprise a portion of a fuse of another OLED circuit element. An exemplary embodiment where a portion of a fuse may be shared is illustrated in FIG. 5 and described in more detail below. In that exemplary embodiment, a portion of the top conductive layer may be ablated if an excess current flows through one pixel (such as when a short occurs in the pixel) and may also be ablated if an excess current flows in an adjacent pixel. However, as defined herein, a pixel (as defined herein) may not be common to multiple OLED circuit elements.

Although embodiments may describe fuses that open an electrical circuit based on a particular method (such as ablation of the fuse), as noted above, fuses may in general open an electrical circuit in any suitable method. Thus, in the above exemplary embodiment, it would be appreciated that the top conductive layer could open an electrical connection in response to an excess current in accordance with any of these known methods.

In some embodiments, the fuse may be separable from the pixel (i.e. a first electrode, a second electrode, and an organic layer), and the fuse may be connected in series with the pixel of each of the OLED circuit elements. When an excess current flows through the pixel (and thereby the fuse because of the series connection), it may cause the fuse to open. Moreover, because the fuse is in series with the pixel, the excess current cannot continue to flow through the pixel after the fuse opens the electrical connection.

In some embodiments, where the first device comprises a plurality of OLED circuit elements, the first or the second electrode in each of the plurality of OLED circuit elements may be the fuse. That is, for instance, the first or the second electrode may be designed or configured to comprise parameters such that it will open an electrical connection in response to an excess current (which as noted above, may be set in accordance with the particular design and purpose of the device, such as 10%, 20%, 50% 200%, or 400% greater than the normal or maximum operational current). Example embodiments where the first or the second electrode may comprise a fuse are shown in FIGS. 4 and 12 and descried herein. The first or the second electrode that comprises a fuse may open an electrical connection in response to an excess current in accordance with any known method, including by way of example, the first or second electrode may be ablated in response to an excess current.

As described above, in general when a fuse is opened, it causes a short fault to become an open fault and current is thereby prevented from flowing through the shorted pixel. For some embodiments where the first or the second electrode is a fuse, the electrode may have a thickness such that, in response to an excess current in the OLED circuit element, the electrode is ablated. In such embodiments, the thickness of the electrode may refer to the dimension of the electrode that is along the axis that is substantially perpendicular to the plane of the substrate. The thickness of an electrode that functions as a fuse may be a function of such conditions and parameters as the electrode material, the normal device operating current, and the short-circuit current (i.e. the current that will flow through the electrode if a short occurs). Any material and thickness may be used as would be understood by one of ordinary skill in the art so long as the electrode functions as a fuse at a desired melting current. For example, the inventors have found that for some embodiments, the electrode may have a thickness between 1 nm and 60 nm and/or the material may be a conductive metal such as aluminum.

In some embodiments, the first device as described above, may be a lighting panel or it may be a consumer device such as a light fixture. As used herein, a "light fixture" may comprise any one of, or some combination of any of the following: a light source or lamp; a reflector; an aperture; a lens; a power supply; a connection to a power source; and/or a light socket to hold the lamp. Although embodiments may be particularly applicable to such commercial devices because these lighting devices may, for instance, not comprise individually addressable pixels and/or other advance circuitry, embodiments are not so limited. Indeed, embodiments and the concepts/features described herein may be used in any suitable OLED.

In some embodiments, the pixel of each of the OLED) circuit elements of the first device as described above may have a surface area between approximately 0.001 and 5.0 $cm^2$. As used in this context, the "surface area of the pixel" may be a measure of a surface area of the first or the second electrode. Preferably, the surface area is the measure of the surface area of a patterned electrode of the pixel (that is, an electrode that may not be common to a plurality of other OLED pixels). In some embodiments, the surface area of the first or second electrode is the area of the surface of the electrode that is substantially parallel to the substrate. For example, with reference to FIG. 3($a$), the surface area may be the measure of the top surface of the electrode 303. In general, the inventors have found that for an electrode (particularly in embodiments where the electrode may comprise a fuse) having a surface area larger than approximately 5.0 $cm^2$ may result in unnecessarily high resistive loses for the OLED. In addition, the inventors have found that in some embodiments, an electrode having a surface area smaller than approximately 0.001 $cm^2$ may unnecessarily increase fabrication cost and decrease fill factor. Thus, in some embodiments, the electrode may have a surface area that is between approximately 0.001 $cm^2$ and 5.0 $cm^2$.

As would be appreciated by one of skill in the art, the reference above to the "surface area" of the pixel may relate to the emissive area of that particular pixel, where the emissive area would be understood to be the relevant portion of the pixel in determining the contribution of the total light emissions of the device that is provided by each pixel. That is, the "emissive area" of a pixel may be a measure of a surface area of the pixel for which charge injection from opposing electrodes and subsequent recombination of charge and light emission is enabled. Thus, for instance, in some embodiments, it may be preferred that the emissive area is between approximately 0.001 and 5.0 $cm^2$. In general, the inventors have found that for a pixel (particularly in some embodiments where the electrode of that pixel may comprise a fuse) having an emissive area larger than approximately 5.0 $cm^2$ may result in unnecessarily high resistive loses for the OLED. In addition, the inventors have found that in some embodiments, a pixel having an emissive area smaller than approximately 0.001 $cm^2$ may unnecessarily increase fabrication cost and decrease fill factor. Thus, in some embodiments, the pixels may have an emissive area that is between approximately 0.001 $cm^2$ and 5.0 $cm^2$.

Similarly, in some embodiments, the emissive area of the pixel of each of the plurality of OLED circuit elements may comprise no more than approximately 10% of the emissive area of the first device. In some embodiments, the emissive area of the pixel of each of the plurality of OLED) circuit elements may comprise no more than approximately 1% of the emissive area of the first device. As noted above, the smaller the emissive area of each pixel, the less impact a non-emitting pixel will have on the overall emission (and thereby the performance of the device).

In some embodiments, in the first device as described herein, the first device may include at least 10 OLED circuit elements. In some embodiments, it may be preferred that the surface area of the pixel of each of the OLED circuit elements comprises no more than 10% of the surface area of the first device. In this manner, if one of the pixels develops a short and thereby a fuse is opened to electrically isolate that pixel, approximately 10% or less of the surface area of the first device will no longer emit light. This may be a small enough percentage of the device such that it may continue to function adequately for its intended purpose (such as a lighting panel that may continue to provide light to an area). As used in this context, the surface area of the first device may be a measure of the surface area of the portion of the substrate that is common to a plurality of pixels. In some instances, the surface area of the device may be the measure of the combined surface area of the pixel of each of the plurality of OLED circuit elements (where the surface area of the pixel was defined above). As noted above, the smaller the number of OLED circuit elements in a device and/or the greater the percentage of the surface area of a device contributable to a single OLED circuit element may result in a device where a short in a small number of OLED circuit elements causes an undesirably large portion of the device to cease emitting light. Thus, in general, it may be desirable to have a larger number of OLED circuit elements such that each OLED circuit elements comprises a smaller percentage of the total surface area of the device (and thereby provides a smaller percentage of the total amount of light that is emitted from the device).

As noted above and as would be appreciated by one of skill in the art, the reference above to the "surface area" of the pixel may relate to the emissive area of that particular pixel, where the emissive area would be understood to be the relevant portion of the pixel in determining the percentage of the total light emissions of the device that is provided by each pixel. Thus, for instance, in some embodiments, it may be preferred that the emissive area of the pixel of each of the OLED circuit elements comprises no more than 10% of the total emissive area of the first device. In this manner, if one of the pixels develops a short and thereby a fuse is opened to electrically isolate that pixel, approximately 10% or less of the total emissive area of the first device will no longer emit light. This may be a small enough percentage of the device such that it may continue to function adequately for its intended purpose (such as a lighting panel that may continue to provide light to an area). The "total emissive area" of the first device may be a measure of the combined emissive area of the pixel of each of the plurality of OLED circuit elements (where the emissive area of the pixel was described above). As noted above, a smaller number of OLED circuit elements in a device and/or a greater percentage of the emissive area of a device contributable to a single OLED circuit element may result in a device where a short in a small number of OLED circuit elements causes an undesirably large portion of the device to cease emitting light. Thus, in general, it may be desirable to have a larger number of OLED circuit elements such that each OLED circuit element comprises a smaller percentage of the total emissive area of the device (and thereby provides a smaller percentage of the total amount of light that is emitted from the device).

In some embodiments, in the first device as described herein, the first electrode of each pixel may be patterned such that it is physically separate from the first electrode of the pixel of each of the other OLED circuit elements. Patterning may be performed by any known method including deposition through a mask, cold welding, and/or patterning associated with some of the deposition methods mentioned above including ink-jet and OVJP. Other methods may also be used. In some embodiments, the second electrode of each pixel may be unpatterned such that the second electrode is common to a plurality of pixels. This may decrease manufacturing costs by reducing the number of fabrication steps and/or decrease the number of electrical components and connections that are needed for the device. In some embodiments, the first electrode may be an anode and the second electrode is a cathode; however, embodiments are not so limited, and in some instances, the first electrode may be a cathode and the second electrode is an anode.

As noted above and would be appreciated by one of skill in the art, the patterning of an electrode such that a plurality of physically separate electrodes are formed that may correspond to each of the pixels does not necessarily mean that each electrode is physically isolated (i.e. that each electrode or pixel comprises a separate electrical "island"). The electrodes may be physically separate components, but may be connected via one or more components, such as through a fuse.

In some embodiments, the second electrode (which may be unpatterned in some embodiments) may be disposed over the substrate, the organic EL material may be disposed over the second electrode, and the first electrode may be patterned and disposed over the organic EL material. Examples of such embodiments are shown in FIGS. 4(a)-(d), 5(a)-(d), 6, and 12(a)-(d). Other material may be disposed between, over, or under, the first and second electrodes and the EL material. However, embodiments are not so limited, and in some instances the first electrode may be patterned and disposed over the substrate, the organic EL material may be disposed over the first electrode, and the second electrode may be disposed over the organic EL material. Other material may be disposed between, over, or under, the first and second electrodes and the EL material.

In some embodiments, in the first device as described above where the second electrode may be disposed over the substrate, the organic EL material may be disposed over the second electrode, and the first electrode may be patterned and is disposed over the organic EL material, the first device may further include a plurality of segmented bus lines. The plurality of bus lines may electrically connect the patterned first electrode of each of the plurality of OLED circuit elements together. The segmented bus lines may comprise thick, highly conductive strips that form electrical interconnects between the first electrodes of the pixel of each of the plurality of OLED circuit elements. In general, because the bus lines may comprise a thick, highly conductive material, they may not transmit light and may result in an inactive area in the first device. It should be understood that an "inactive area" may refer to a "non-emissive" area of the device (i.e. an area that does not emit light). Therefore, it may be desirable to limit the amount of space occupied by such components. An example of such an embodiment is shown in FIGS. 4(a)-4(d) and described in more detail below.

In some embodiments, in the first device as described above, the first electrode of each of the plurality of OLED circuit elements may comprise a fuse such that the first electrode may be configured to open an electrical connection in response to an excess current in accordance with any known method, including by way of example, the first electrode may be ablated in response to a short circuit or an excess current. As described above, when the fuse opens the circuit, it causes the short fault to become an open fault and current is thereby prevented from flowing through the shorted pixel. The use of the first electrode in some embodiments as a fuse may reduce fabrication steps and simplify manufacturing, as an additional component need not be included therein to form an electrical connection and also comprise a fuse.

In some embodiments, in the first device as described above where the first electrode comprises a fuse, the first electrode may have a thickness such that it may conduct current efficiently in normal operation (i.e. it may create an acceptable amount of resistive power loss due to the sheet resistance of the material and the current flowing through the electrode), yet the first electrode will still open the circuit should a fault occur (e.g. if an excess current above the melting point (i.e. melting current) flows through the electrode). As used in this context, the "thickness" of the first electrode may refer to the dimension of the electrode that is along the axis that is substantially perpendicular to the plane of the substrate. Although the first electrode may comprise any material and any thickness so long as it functions as a fuse, the inventors have found that a preferred range of thicknesses for an electrode comprising aluminum is between approximately 1.0 nm and 60 nm. The inventors have also found that a preferred value for the sheet resistance of the first electrode is between approximately 0.1 Ω/sq. and 500 Ω/sq, where the sheet resistance is a measure of resistance of thin films that are namely uniform in thickness. These parameters were found to both conduct currents during normal operations of many exemplary devices, as well as to open an electrical connection (e.g. by ablating) when a current above these normal operating conditions was generated and flowed through the electrode.

Although with regard to the above examples and exemplary embodiments, reference was made to an electrode comprising aluminum, as would be understood by one of ordinary skill in the art, other suitable materials may also be used for one or both electrodes. For instance, electrodes may comprise such materials magnesium and silver alloys (Mg:Ag) or any other suitable conductive material.

As noted above, in some embodiments the first device may include segmented bus lines that may be disposed over the first electrode of each of the OLED circuit elements. In some embodiments, the segmented bus lines may be disposed below or between the patterned first electrode of each of the plurality of OLED circuit elements. In some embodiments, such as when the first electrode of each OLED circuit element comprises a fuse, the patterned first electrode of each of the OLED circuit elements may be directly connected to less than five segmented bus lines. An example of this is shown in FIGS. 4(a)-(d) and described below. In some embodiments, it may be preferred that the segmented bus lines are electrically connected to the first electrode of exactly two of the OLED circuit elements. One potential advantage that some embodiments that utilize segmented bus lines may provide is that they may be tolerant to faults that may occur in one of the plurality of segmented bus lines (i.e. a fault that may not occur within one of the pixels of the device). For instance, if a short fault occurs in some such embodiments at one of the plurality of segmented bus lines, the excess current may flow through the first electrode of one or more of the plurality of OLED circuit elements. This excess current may be sufficient to ablate the first electrode and thereby cause an open circuit. As the segmented bus lines may not be electrically connected to any other segmented bus lines in some embodiments, the ablation of the first electrodes by the excess current may thereby cause the shorted segmented bus line to become electrically isolated.

In some embodiments, in the first device as described above where the second electrode may be disposed over the substrate, the organic EL material may be disposed over the second electrode, and the first electrode may be patterned and disposed over the organic EL material, the first device may further include a thin layer of conductive material that electrically connects the patterned first electrode of each of the plurality of OLED circuit elements together. An example of this is shown in FIGS. 5($a$)-($d$) and described in more detail below. The thickness of the thick (i.e. the first patterned electrode) and the thin layer of conductive material may refer to the dimension of the layer that is disposed along the axis that is perpendicular to the plane of the substrate.

In some embodiments, the thin layer of conductive material may be disposed over the first electrode (i.e. the thick layer) of each of the plurality OLED circuit elements; however, embodiments are not so limited and the first electrode of each of the plurality of OLED circuit elements may be disposed over the thin layer of conductive material. In some embodiments, a portion of the thin layer of conductive material may be disposed directly on top of the first electrode of each of the plurality of OLED circuit elements, while another portion (or portions) may be disposed over the area of the first device between the first electrode of each of the plurality of OLED circuit elements. The thin layer of conductive material may thereby serve to conduct current between the OLED circuit elements. Again, this is illustrated in the exemplary embodiment shown in FIGS. 5($a$)-($d$) where the thin layer disposed directly over the first electrode 501 of the plurality of OLED circuit elements is shown as element 502, and the portion of the thin layer disposed over the area between the first electrodes 501 is shown as element 506.

The thin layer of conductive material may also comprise a fuse in some embodiments. For example, the fuse may comprise the portion of the thin layer of conductive material that is disposed between, or over, the area of the first device that is between the first electrode of each of the plurality of OLED circuit elements. The thin layer of conductive material may have a thickness such that when an excess current (e.g. a current equal to or greater than the melting point of the layer) flows through a portion of the thin layer, that portion is ablated. For instance, when a short occurs in the pixel of an OLED circuit element, the excess current may ablate the portions of the thin layer of conductive material disposed between the first electrode of the shorted OLED circuit element and the first electrode of the other OLED circuit elements. In this manner, the shorted pixel may be electrically isolated from the other pixels of the first device.

As noted above, the patterned first electrode of each pixel in some embodiments may comprise a thick layer of conductive material. The characteristics of the thick layer of conductive material may be chosen so that it may conduct electricity efficiently (e.g. with low resistive loses) and may not ablate based on an excess current that is less than the melting point of the thin layer disposed between the first electrode of each of the OLED circuit elements. The inventors have found that in some embodiments, a preferred thickness of the thick layer of conductive material may be between approximately 10 nm and 500 nm, while the thickness of the thin layer of conductive material may be between approximately 1 nm and 60 nm. In generally, the inventors have found that that it may be generally preferred that the thick layer of conductive material has a thickness that is approximately twice as large as the thin layer of conductive material. However, any thickness of the thick layer and thin layer of conductive material that enables a portion of the thin layer of conductive material to ablate in response to an excess current, such when a short occurs, may be utilized.

In some embodiments, each of the OLED circuit elements may comprises a thick layer of conductive material and at least a portion of the thin layer of conductive material (i.e. the first electrode may include both the thick layer of material and the thin layer of material, which may have been deposited over the first electrode; however, in some embodiments, the thick layer and the thin layer of conductive material may comprise the same material, and thereby the two layers may comprise the first electrode). In some embodiments, a fuse may be utilized to electrically connect the first electrode to the thin conductive layer.

The thin layer of conductive material may be unpatterned in some embodiments. That is, for instance, the unpatterned layer may be deposited as a blanket layer. However, embodiments are not so limited, and in some instances, the first device may comprise a patterned thin layer of conductive material that electrically connects the first electrode (i.e. the thick layer) of each of the plurality of OLED circuit elements together. As noted above, the thick layer of conductive material and the thin layer of conductive material may comprise the same material. For instance, both the thick layer of conductive material that comprises the first electrode and the thin layer of conductive material (that may comprise a fuse) may comprise Al. In some embodiments, the thick layer and thin layer of conductive material may be deposited at the same time or may be deposited separately. In some embodiments, the material for the thick conductive material and the thin conductive material may be different.

It should be noted that although reference was made above to a "thick" layer of conductive material (i.e. the electrode) and a "thin" layer of conductive material, the actual thickness of each of these components (and, correspondingly, the relative thickness of the two layers of conductive material) may depend on a variety of factors, including the material used for each layer. For example, in some embodiments the "thick" and the "thin" conductive layers may have approximately the same thickness (or the "thin" layer may even have a greater thickness than the "thick" layer), but the "thin" layer of conductive material may comprise a material that has a higher resistivity and/or a lower melting temperature than the "thick" layer of conductive material. Thus, in the embodiments described above, reference could also be made to a "first" layer (in place of a "thick" layer) of conductive material and a "second" layer (in place of a "thin" layer) of conductive material to describe the exemplary structures.

To further illustrate the above, in some embodiments in the first device as described above, the second electrode may be disposed over the substrate, the organic EL material may be disposed over the second electrode, a first layer of conductive material (i.e. the "thick layer" as referenced above) may be patterned and disposed over the organic EL material, and a second layer of conductive material (i.e. the "thin layer" as referenced above) that electrically connects the patterned first layer of conductive material of each of the plurality of OLED circuit elements together. An example of this is shown in FIGS. 5(a)-(d) and described in more detail below. In some embodiments the first layer of conductive material may have a thickness that is greater than, less than, or approximately equal to the thickness of the second layer of conductive material. The thickness of the first layer (i.e. the first patterned electrode) and the second layer of conductive material may refer to the dimension of the layer that is disposed along the axis that is perpendicular to the plane of the substrate.

In some embodiments, the second layer of conductive material may comprise a fuse. For instance, the second layer may: comprise substantially the same material as the first layer, but have a smaller thickness comprise a different material than the first layer (whether the material is more or less conductive than the first layer), and have a smaller thickness than the first layer; comprise a different material than the first layer (whether the material is more or less conductive than the first layer), and have a lower melting temperature than the first layer; comprise the same or different material as the first layer (but be less conductive) and have a larger thickness than the first layer; or any other suitable arrangement such that the second layer may open an electrical connection in response to a short fault.

In some embodiments, in the first device as described above where the second electrode may be disposed over the substrate, the organic EL material may be disposed over the second electrode, and the first electrode may be patterned and disposed over the organic EL material, the first device may further include a top conductive layer and an insulating layer. The insulating layer may be disposed over a part of the first electrode of each of the plurality of OLED circuit elements, and the top conductive layer may be disposed over the insulator. A fuse may electrically connect the first electrode of each of the plurality of OLED circuit elements with the top conductor. An example of such an embodiment is shown in FIGS. 6(a)-(d) and described below. Preferably, in some embodiments, the fuse comprises a part of the top conductive layer. For instance, the fuse may comprise the same material as the top conductive layer and be deposited during the same process and/or at the same time. This may decrease manufacturing time and expense. However, embodiments are not so limited, and thus the fuse may also comprise a different material, which may be based on the desired characteristics of the device and/or fuse, such as the desired melting point.

The insulating layer (which may be disposed above the first electrodes but below the top conductive layer) may be patterned in some embodiments so as to allow a fuse to connect the top conductor and the first electrode of each of the plurality of OLED circuit elements. For instance, the insulating layer may comprise a plurality of patterned insulating segments having a surface area less than a surface area of the first electrode of each of the OLED circuit elements. The portion of the first electrode that the insulating layer was not disposed directly over may be electrically connected by a fuse to the top conductive layer. This is shown in the exemplary embodiment of FIGS. 6(a)-(d). However, it should be understood that any configuration of the insulating layer that permits the top conductive layer to connect to the first electrode through a fuse is contemplated as within the scope of this embodiment. In some embodiments, it may be preferred that the top conductive layer is unpatterned so as to reduce fabrication steps and costs. For instance, the top conductive layer may be a blanket layer. The top conductive layer may also be highly conductive; thereby reducing resistive power losses in the device.

In some embodiments where the flow of current through the fuse is substantially perpendicular to the plane of the substrate, the fuse materials may comprise a highly conductive metal, such as aluminum (which may be opaque). This may be due, in-part, because the fuse may have a small surface area such that it does not block a substantial amount of the active area (i.e. the emissive area) of the OLED circuit element and thereby need not be transparent. That is, for instance, because the fuse may be made of a highly conductive metal, the cross-sectional area of the fuse may be much smaller than when a transparent conductive oxide (TCO) such as indium tin oxide (ITO) is used and still conduct a sufficient amount of current without opening the circuit (i.e. because the material may be more conductive, less heat is generated for the same amount of current, and thereby more current may flow through the same size fuse without reaching the melting current of the fuse). In general, there may be greater flexibility in the design of the fuse geometry in such embodiments because there is less limitation on the preferred range of the dimensions of the fuse on the axis that is perpendicular to the current flow direction.

In some embodiments, in the first device as described above, where the first electrode may be patterned and disposed over the substrate, the organic EL material may be disposed over the patterned first electrode, and the second electrode may be disposed over the organic EL material, the first device may further include a bus line disposed over the substrate. The patterned first electrode of each of the plurality of OLED circuit elements may be electrically connected to the bus line through at least one fuse. An example of such embodiments is shown in FIG. 7 and described herein. In some embodiments, the patterned first electrode of each of the plurality of OLED circuit elements may be fabricated in a single step with the fuses (such as through lithography or deposition steps), which may decrease fabrication time and costs. In some embodiments, the fuse and the first electrode may comprise the same material.

The reference to a "single step" above, and as would be appreciated by one of ordinary skill in the art, refers to performing the fabrication of the fuse and the electrode simultaneously. That is, each component may be fabricated simultaneously, even if there are multiple processes involved in the fabrication. For example, the process of patterning the electrodes and the fuses may include both photolithography and chemical etching processes. However, these processes may be performed simultaneously in what may be considered essentially the same fabrication step because, for instance, the components may be patterned from the same layer of conductive material that was deposited on a substrate. As described below, the fabrication of the fuse and the electrode simultaneously may provide some increased efficiencies, freedom of design (particularly with regard to the fuse design), and/or reduce manufacturing costs.

An insulating layer may be disposed between each of the fuses and the organic EL material in some embodiments. This insulating layer may serve to protect the EL material from damage when a fuse is opened due to an excess current, such as, for instance, when there is a short circuit in the OLED circuit element. In some embodiments, the insulating layer may be disposed over the fuses, and the organic EL material may be disposed over the insulating layer. In some embodiments, the insulating layer may form a grid layer over the substrate. The grid layer may define the emissive area of each pixel. For instance, the grid layer may comprise a layer of insulating material that is disposed in the area of the device around (i.e. over) the fuses and in-between the first electrodes of the OLED circuit elements in the first device. In some embodiments, the plurality of OLED circuit elements may be disposed on the substrate in the same plane as the bus line. For instance, the bus line may not be disposed over the OLED circuit element, and the OLED circuit element may not be disposed over the bus line.

The fuses may connect the first electrode of each OLED circuit element to the bus line in some embodiments. Generally, fuse materials used in such embodiments may comprise TCOs, such as ITO or IZO. The cross-sectional area of the fuse may typically be designed so as to be large enough to ensure sufficiently high conductivity, yet small enough to ensure sufficiently high transparency (such that the fuses do not significantly impede the light emitted from the device). In some embodiments, where the fuse and electrode are patterned from the same material, at substantially the same time, and/or to substantially the same thickness, some properties of the fuse may be determined by parameters preferred for the electrode performance. For example, where it is desired that the electrode is transparent, the fuse material and thickness may be selected with this criteria in mind. Other fuse parameters (such as the width of the fuse) may also be used to ensure that the fuse functions as a fuse (that is, so that the fuse opens the electrical connection in response to an excess current). The inventors have found that a preferred range of the thickness of the fuse in some embodiments may be between approximately 30 nm and 300 nm.

Figure 8:
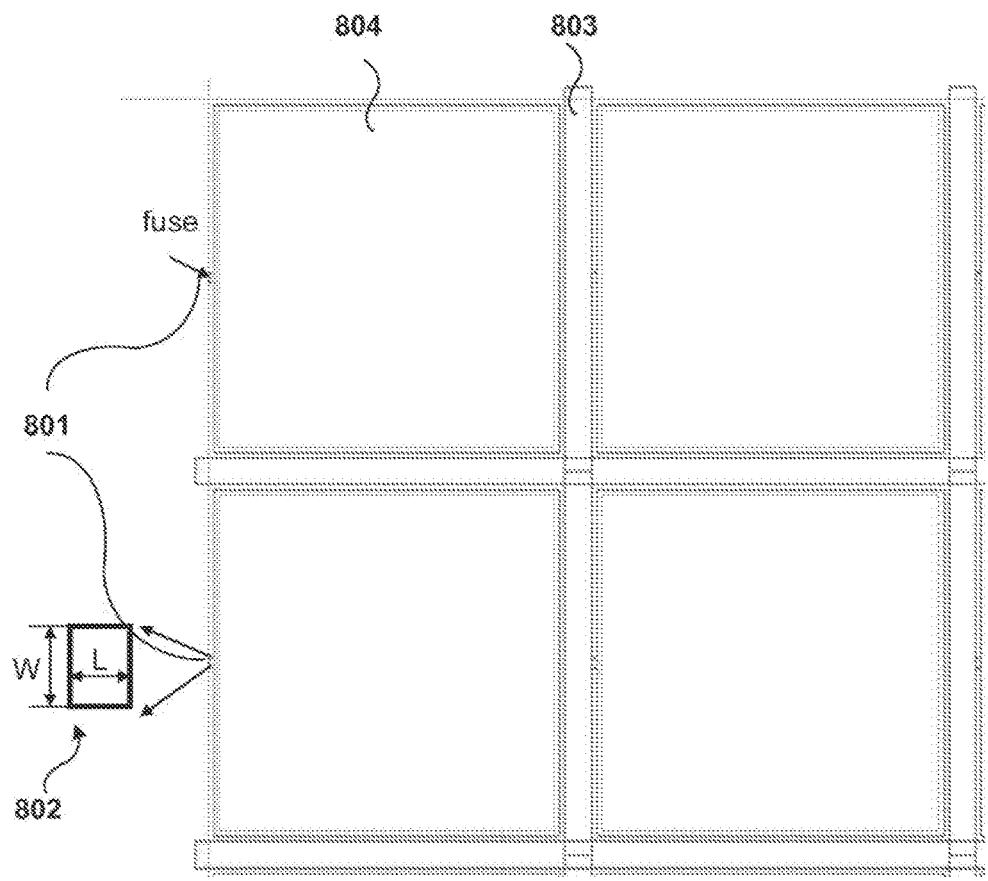
FIG. 8 shows an exemplary OLED panel layout in accordance some embodiments.

In addition to the thickness of the fuse, the ratio of the length of the fuse to the width of the fuse in some embodiments (where the width of the fuse, as illustrated by fuse shown in FIG. 8, is the dimension of the cross-sectional area that is not the thickness) may preferably be low enough such that the fuse is conductive tinder normal operation (i.e. the length divided by the width is sufficiently low), but be high enough so as to generate enough heat to burn the fuse upon the occurrence of an excess current through the fuse (i.e. the length divided by the width is sufficiently high). As would be understood by one of ordinary skill in the art, the fuse may also open an electrical circuit in response to an excess current in any suitable manner, including ablating, cracking, or any of the other known methods described above. That is, generally the greater the width of the fuse, the less resistance the component will have and the greater the current needed to open the fuse. In contrast, generally the longer the length of the fuse, the greater the resistance and thereby the less current that may be needed to open the fuse. The inventors have found in this regard that a preferred range for the fuses is to have a length-to-width ratio between 0.1 and 5.0. However, any length to width ratio that enables the fuse to open an electrical connection in response to an excess current, such as when a short circuit occurs (or begins to occur), is contemplated as within these embodiments.

The bus line may, in some embodiments, be an integrated bus line such that a single bus line electrically connects to the first electrode of each of the plurality of OLED circuit elements through a fuse. In some embodiments, the bus line may comprise a plurality of segmented bus lines.

In some embodiments, in the first device as described above, where the second electrode may be disposed over the substrate, the organic EL material may be disposed over the second electrode, and the first electrode may be patterned and disposed over the organic EL material, the first device may further include an integrated bus line. The integrated bus line may electrically connect each of the plurality of OLED circuit elements together. Preferably, the integrated bus line may be disposed in the area of the first device between the first electrode of each of the plurality of OLED circuit elements. As used in this context, "between" may refer to when at least a portion of the bus line is in the plane of the first electrode of the plurality of OLED circuit elements and the bus line thereby separates the first electrodes. An example of such embodiments is shown in FIGS. 12(*a*)-(*d*) and described below. However, in some instances, a portion of the bus line may extend over the first electrode of an OLED circuit element. In some embodiments, the integrated bus line may be disposed over the first electrode of the plurality of OLED circuit element. The first electrode of each OLED circuit element may directly connect to the integrated bus line, or may electrically connect to the bus line though another circuit component.

In some embodiments, the first electrode of each of the plurality of OLED circuit elements may be the fuse. Thus, it may be preferable that the first electrode of each of the OLED circuit elements may have a thickness such that it is ablated in response to an excess current. The thickness of the fuse in some such embodiments may be the dimension of the fuse that is disposed substantially along the axis that is perpendicular to the plane of the substrate.

A first method for fabricating an OLED with a short tolerant structure may also be provided. The first method may include obtaining (or providing) a substrate having a first electrode. As used in this context, "obtaining" may comprise, for example, depositing a layer of conductive material on a substrate, wherein the layer of conductive material will form, at least in part, a first electrode on an OLED circuit element. In some embodiments, "obtaining a substrate having a first electrode" may also comprise receiving a substrate that already comprises a layer of conductive material disposed thereon. In general, any method of obtaining or providing a substrate is contemplated to be within the scope of this embodiment.

The first method may further include depositing an organic EL material over the first electrode. Any suitable method of depositing EL material, including those discussed above, may be utilized as would be understood by one of ordinary skill in the art.

The first method may further include depositing a plurality of physically segmented second electrodes over the organic EL material. The step of depositing the segmented second electrodes may include any method for depositing a patterned layer in an OLED, including those discussed above, such as by way of example only, deposition through a mask, cold welding, and/or patterning associated with some of the deposition methods such as ink-jet and OVJP. Other methods may also be used, as would be understood by one of ordinary skill in the art.

The first method may further include, in some embodiments, the step of depositing an insulating material over the physically segmented second electrodes, such that a portion of each of the second electrodes remains exposed through the insulating material. The first method may include depositing an unpatterned blanket layer of a conductive material such that the blanket layer of conductive material electrically connects to the portion of each of the second electrodes that remains exposed through the insulating material. The electrical connections between the unpatterned blanket layer of conductive material and the exposed portion of each of the plurality of second electrodes may form a fuse (such as in the embodiment shown in FIGS. 6(a)-(d)). In this manner, the fuse may comprise a portion of the unpatterned blanket layer. For instance, the fuse and the unpatterned blanket layer may comprise the same material and/or be deposited in the same process. This may reduce the number of fabrication steps and thereby reduce manufacturing costs. This may also increase reliability and/or decrease manufacturing error because an electrical connection between the first electrode and the top conductive layer may be more readily obtained. However, embodiments are not so limited, and in some embodiments, the fuse may comprise a different material from the unpatterned blanket layer. Further, in some embodiments, the fuse may be deposited in a separate process from the deposition of the unpatterned blanket layer.

A second method for fabricating an OLED with a short tolerant structure is also provided. The second method may include obtaining or providing a substrate having a first conductive layer disposed thereon. As noted above, "obtaining a substrate" may comprise, for example, depositing a layer of conductive material on a substrate. In some embodiments, obtaining a substrate having a first conductive layer may comprise receiving a substrate that already comprises a layer of conductive material disposed thereon. However, any method of obtaining a substrate is contemplated to be within the scope of this embodiment. Preferably, the first conductive layer comprises a TCO such as ITO or IZO (which is often considered a suitable alternative material to ITO for many applications).

In some embodiments, the second method may further comprise defining a plurality of physically segmented first electrodes on the first conductive layer. The first electrodes may be defined such that they are not electrically connected in series. A plurality of fuses may also be defined on the first conductive layer. In some embodiments, the first electrode and the fuses may be defined at the same time, thereby decreasing the number of steps performed in the manufacturing processes. The first electrode and the fuses may be defined by, for instance, using photolithography. However, any suitable method for defining the fuses and the first electrodes may be used, as would be understood by one of ordinary skill in the art. For example, the step of defining (e.g. patterning) the first electrode and the fuse may include photolithography followed by wet or dry etching, where the fuse and electrode are each defined simultaneously. In some embodiments, the first electrodes may comprise the anodes of a pixel of each of a plurality of OLED circuit elements that comprise a device.

The second method may further include fabricating a bus line over the substrate. This fabrication step may include, in some embodiments, depositing a conductive material onto the substrate. The bus line may comprise a highly conductive material. In some embodiments, the bus line may be an integrated bus line or it may comprise a plurality of segmented bus lines. In some embodiments, each of the plurality of segmented (e.g. patterned) first electrodes may be electrically connected to the bus line through at least one fuse. In this manner, if excess current arising from a short circuit (or any other source) begins to flow through the segmented first electrode, the first electrode may be electrically isolated from the rest of the components of the device by the fuse (i.e. the fuse may open an electrical connection and thereby electrically isolate the short). In some embodiments, the fuses may be configured so as to ablate in response to an excess current. For instance, the fuses may have a thickness such that at normal operation (i.e. normal operational current levels), the fuse conducts current between the bus line and the first electrode; however, when excess current is provided (e.g. based on a short), the current ablates the fuse.

That is, for example, if excess current arising from a short circuit (or any other source) begins to flow through a segment of the first electrode (i.e. the first electrode of one of the pixels), the segmented first electrode of that pixel may be electrically isolated from the rest of the components of the device (e.g. the other pixels) by the fuse (i.e. the fuse may open an electrical connection and thereby electrically isolate the short). In some embodiments, the fuses may be configured so as to ablate, crack, or open the electrical circuit through any other chemical or physical process in response to an excess current.

Continuing with the second method as described above, the second method may include step of depositing organic EL material over the first electrodes (preferably after the bus line is fabricated over the substrate). In general, the step of depositing the organic EL material may be performed after the bus line is fabricated so as to decrease the likelihood of damage to the more sensitive organic material during the fabrication of the bus line. The second method may further include depositing a second electrode over the organic EL material. The second electrode may comprise a blanket layer such that a plurality of OLED circuit elements shares a common second electrode. However, embodiments are not so limited, and therefore in some embodiments, the second electrode may be deposited as a patterned layer.

According to some embodiments, the second method of fabricating an OLED comprising a short tolerant structure may include the step of depositing an insulting layer over the fuses. It may be preferred, in some embodiments, that the insulating layer may be disposed so that the EL material is not damaged when a fuse opens an electrical connection. The insulating layer may be deposited over the bus line and/or in the area of the device in-between the pixels of the OLED circuit elements so as to form a grid layer that defines the emissive pixel areas.

In some embodiments, a first device may be provided. The first device may include a substrate and a plurality of OLED circuit elements disposed on the substrate. Each of the OLED circuit elements may include one, and only one, pixel. As noted above, the OLED circuit element may include other circuit components as well. Each OLED circuit element may include a fuse adapted to open an electrical connection in response to excess current in the pixel. For example, the fuse may open a circuit if a short begins to develop in or near the pixel. The OLED circuit elements may include more than one fuse, such as when a plurality of fuses is electrically connected in parallel. Each pixel may include a first electrode, a second electrode, and an organic electroluminescent (EL) material disposed between the first and the second electrodes. In some embodiments, each of the OLED circuit elements may not be electrically connected in series with any other of the OLED circuit elements.

In some embodiments, in the first device as described above, the plurality of OLED circuit elements may be commonly addressable. Such embodiments may, for instance, correspond to a lighting device in which there may be no need or requirement that each of the OLED circuit elements be individually addressable (which may typically be the case for a display such as an AMOLED or PMOLED). That is, in some applications, for example where the first device may comprise a lighting panel, the functionality of the first device may be such that each of the OLED circuit elements may be electrically connected so that each pixel is illuminated (or not illuminated) at the same time. This may be preferred so as to reduce the fabrication costs associated with the circuitry and control units that may otherwise be required for addressing each pixel individually (or a group of pixels). Previously, when designing lighting panels, it was generally the case that it was desirable that such devices comprise as few separate OLED pixels as possible because defining each pixel (including electrical connections as needed) would increase costs and/or affect the uniformity of the device. However, as noted above, the inventors have found that in some embodiments by increasing the number of pixels, and electrically connecting the pixels in parallel, if an excess current were to occur in one or more of the pixels, the effect could be minimized by the fuses corresponding to each pixel so as to not appreciably alter the overall performance of the device. Moreover, unlike a display such as an AMOLED or PMOLED, the number of pixels in such embodiments may not be dictated by the desired resolution of the device. That is, for instance, the number of pixels in a display is typically based on the resolution of the display and is thereby pre-determined. In some embodiments of devices provided herein, the device may comprise any number of pixels and in any configuration so as to minimize the effect of a short in one or more pixels, while keeping fabrication costs within a tolerable limit and providing more design freedom.

It should be noted that embodiments are not so limited to commonly addressable embodiments, and in some instances, one or more of the OLED circuit elements may be separately addressable from one or more of the other OLED circuit elements.

In some embodiments, in the first device as described above, the fuse may comprise substantially the same material as the first electrode. By "substantially the same" it is generally meant that the fuse and the first electrode may comprise the same concentration materials and/or combinations of materials, within experimental or manufacturing error (e.g. within 5% of the amount and/or concentration of materials). In some embodiments, the fuse may comprise the same material as the first electrode.

Such embodiments may provide the advantage that the first electrode and the fuse may be fabricated in the same step (e.g. deposited at the same time or defined during the same process from the same layer of deposited material), thereby reducing the costs and complexity of manufacturing. Moreover, the inventors have found that utilizing the same or similar material as the first electrode for the fuse (rather than, for instance, using the same or similar material as the bus line) may be advantageous in some instances because the electrode may comprise a more resistive (e.g. less conductive) material than the bus line. Examples of such materials may include transparent conductive oxides (TCO), such as ITO or IZO. This may permit the fuse to have a larger thickness (e.g. on the order of approximately 100 nm), while still providing the desired functionality of opening an electrical connection when an excess current is conducted through the pixel. In general, the larger the dimensions of a component, the more efficiently and accurately it may be fabricated. In contrast, the bus line of some devices may comprise a more conductive material (e.g. Aluminum, Copper, Gold, or Silver), particularly in embodiments where there may be a large number of pixels connected in parallel (which may more conductive bus line to carry a large amount of current with less resistive power loss). If a fuse was to comprise the same material as the bus line in such embodiments, the fuse would likely require a relatively small thickness (and/or width) so that it would still function properly as a fuse for typical currents of an OLED. As an example, in a typical lighting panel, a fuse that comprises Aluminum may require a thickness that is less than or equally to 10 nm. Fuses having such small dimensions for a thickness may be more difficult to accurately and efficiently fabricate, and may thereby increase the costs and/or manufacturing failures of such devices. The more conductive materials may also be less transparent than TCO materials, and may thereby block portions of the light emitting area of the device, which may limit the type of OLED that may be fabricated.

Moreover, in general, it may be desirable to utilize a bus line that has a high conductivity to reduce resistive loses and maintain a uniform voltage across the panel (at least as uniform as may be achieved). Thus, by forming the fuse and/or electrode of a different material than the bus line, embodiments may provide for greater design freedom, including the potential choice of components for the bus line that may take into consideration factors such as costs, uniformity of the panel, transparency, etc., without the further constraint of choosing a material such that the fuses will operate at a desired current.

In some embodiments, in the first device as described above, the fuse and the first electrode may each have a thickness and the thickness of the fuse and the thickness of the first electrode may be approximately the same. By "approximately the same," it is generally meant that the thickness of the fuse and the electrode may be within 10% of one another. In this context, the "thickness" of the fuse and the thickness of the first electrode may refer to the dimension of the fuse and the electrode that is substantially perpendicular to the plane of the substrate. Thus, the thickness may, in some instances, be the result of the amount of material deposited during a single deposition step. In some embodiments, the fuse may have approximately the same thickness and comprise the same (or substantially the same) material as the first electrode. The fuse and the electrode may thereby be fabricated during, for instance, the same deposition step or may be formed from the same layer of deposited material (e.g. using photolithography, which may be followed by wet or dry etching). As noted above, this may reduce the number of fabrication steps, including the requirement to accurately align a plurality of deposition masks during manufacturing of each of these components.

In some embodiments, in the first device as described above, the first electrode may be patterned, the first electrode may be disposed over the substrate, the organic EL material may be disposed over the first electrode, the second electrode may be disposed over the organic EL material, a bus line may be disposed over the substrate, and the first electrode of each of the plurality of OLED circuit elements may be electrically connected to the bus line through the fuse. An example of such a layout is shown in FIGS. 7(*a*) and (*b*); however, embodiments are not so limited. In some embodiments, the fuse and the first electrode may each have a thickness and the thickness of the fuse and the thickness of the first electrode may be approximately the same. As noted above, such embodiments where the thicknesses of the fuse and the first electrode are substantially the same may enable each component to be fabricated in the same step (such as during the same deposition of materials or defined from the same layer of previously deposited material). It should be noted that, in general, if the fuse and the first electrode have approximately the same thickness and comprise the substantially same material, than the fuse will likely be designed to have a different (and smaller) width than the first electrode such that the fuse will have a higher resistance than the electrode when the same current flows through each component, and thereby the fuse will open the circuit in response to an excess current. In some embodiments, the bus line may also have a thickness such that the thickness of the fuse and the thickness of the bus line may be different. That is, for instance, the bus line may have a thickness that is independent of the fuse, which may enable each of these components to be designed so as to maximize its functionality (e.g. the bus line may be chosen so as to have a thickness and material to effectively conduct electricity with low resistive power losses, while the fuse may be chosen so as to open an electrical circuit in response to an excess current and have other properties that may be desirable such as transparency).

In this regard, in some embodiments of the first device comprising a bus line that is connected to each pixel via a fuse, the fuse may comprise substantially the same material as the first electrode and/or the fuse may comprise a different material than the bus line. In some embodiments, the fuse may comprise a transparent conductive oxide, such as ITO or IZO.

In some embodiments, in the first device as described above, the fuse and the first electrode are integrally coupled. As used in this context, "integrally coupled" may refer to when the fuse and the first electrode are fabricated in the same manufacturing step and may comprise the same material such that the fuse may be viewed as a component of the electrode (but may have a different dimension, such as its width). In this regard, the fuse itself may not comprise a "separate" component, but may be a continuous extension of the first electrode; however, the fuse may be designed such that as an excess current begins to flow through the first electrode, the fuse opens the electrical circuit.

The inventors have also found that it may be beneficial in some embodiments to electrically connect each of the OLED circuit elements to a plurality of fuses, where each fuse is electrically connected in parallel. For example, in the first exemplary device as described comprising a bus line, each pixel may be electrically connected to the bus line via two or more fuses. Replacing a single fuse with multiple smaller fuses may provide several advantages. First, it may provide more tolerance in design and manufacturing process. Second, multiple smaller fuses may help to distribute heat so there is no concentrated heat in one spot. Third, multiple fuses provide redundancy so even if one fuse is not functional (e.g. due to defects or particles) the rest of fuses still keep the pixel working. Moreover, by controlling the width of the fuses, embodiments may enable the thickness of the fuses to correspond to, for instance, the thickness of the first electrode such that each may be fabricated in a single step.

Reference will now be made to the remaining figures to illustrate several embodiments. These embodiments are designed to be exemplary, and are not to be construed as limiting or as an exhaustive list. The figures and discussions presented below focus on several configurations of segmented electrodes and fuses, and thereby may omit other portions or details of the OLED device for simplicity.

First Exemplary Embodiment

FIGS. 4(a)-(d) show an exemplary embodiment of the first device that comprises a plurality of patterned thin conductive first electrodes 401 and segmented highly conductive bus lines 402. In particular, FIG. 4 (a) shows the exemplary embodiment of the first device in normal operation; FIG. 4 (b) shows the cross-sectional view of this exemplary embodiment in normal operation; FIG. 4 (c) shows the same exemplary embodiment of the first device after a fault has occurred; and FIG. 4 (d) shows the cross-sectional view of this exemplary embodiment after a fault has occurred.

Although the referred to as a "thin conductive first electrode," as would be understood by one of ordinary skill in the art, the actual thickness of the first electrode may depend on a variety of factors, including, by way of example, the material of the first electrode (e.g. its conductivity) and the current at which the first electrode may act as a fuse so as to open an electrical connection.

With particular reference to FIGS. 4 (b) and (d), this exemplary embodiment comprises a plurality of OLED circuit elements each having a pixel 400, where each pixel has a second electrode 404 disposed over a substrate 403; an organic EL material 405 disposed over the second electrode 404; and a first electrode 401 that is patterned and is disposed over the organic EL material 405. A plurality of segmented bus lines 402 electrically connects the patterned first electrode 401 of each of the plurality of OLED circuit elements together. As shown in FIGS. 4(a)-(d), the plurality of segmented bus lines 402 are disposed over the first electrodes 401. In some embodiments, the segmented bus lines 402 may be disposed in other locations, including over, under, or between the first electrodes 401 of each of the OLED circuit element. According to the exemplary embodiment shown in FIGS. 4(a)-(d), the first electrode 401 of each pixel 400 of the plurality of OLED circuit elements is a fuse. That is, the first electrode 401 has a thickness such that, in response to an excess current, the first electrode 401 may be ablated (or otherwise open the electrical connection). In this exemplary embodiment, the thickness of the first electrode 401 refers to the dimension of the first electrode 401 that is disposed substantially along the axis that is perpendicular to the plane of the substrate 403.

In some embodiments, where the first electrode 401 comprises the fuse, the inventors have found that an acceptable range for the thickness of the first electrode 401 to operate effectively as a fuse may be between approximately 1 nm and 60 nm for fuses comprising aluminum (or any other suitable material, such as Mg:Ag) in some commercial devices. This relatively low thickness may be used in some embodiments because the electrode material may typically comprise a high conductivity metal, such as aluminum, which is designed to ablate (or otherwise open the electrical connection) in response to an excess current (such as when a short circuit begins to form). As another example, for a first electrode comprising indium tin oxide (ITO) and having dimensions 30 μm×30 μm, in a device designed to have a melting current for the fuse of 30 mA, a thickness for the first electrode so that is functions properly as a fuse at 30 mA was found to be approximately 120 nm. However, as noted above, any thickness or material may be used based on the desired properties of the device, as would be understood by one of ordinary skill in the art. For example, a fuse could be fabricated, tested for a melting current by determining the current at which it ablates (or otherwise opens an electrical connection), and then the parameters could be adjusted (e.g. dimensions or materials) to obtain a desired functionality (i.e. melting current), as was described above.

FIG. 4 (a) shows a top view of the first device according to this exemplary embodiment in normal operation. During normal operation, the current through the first device is approximately equally divided by the total number of rows ($n_{row}$) shown in FIG. 4 (a). Therefore, the maximum current in each row is approximately $I_{on}=I_o/n_{row}$, where $I_o$ is the total current flowing through the device. In the example shown in FIG. 4, there are 5 rows, so ideally (i.e. without considering imperfections of the device) $I_{on}=I_o/5$. This is the maximum current through the first electrode 401 at normal operation.

FIGS. 4 (*c*) and (*d*) show the first device after the occurrence of a short fault (or other excess current). When a pixel 400 is shorted, nearly all the current $I_{off}=I_o$ will flow through this pixel 400 at the location of the short (or there will be a significant increase in the current). According to this exemplary embodiment, the first electrode 401 of each of the plurality of OLED circuit elements has a thickness such that when a large current flows through a shorted first electrode 406, the shorted first electrode 406 will heat up and be ablated from the organic layer 405, thereby acting as a fuse to open the electrical connection. When the first electrode of one of the OLED circuit elements is ablated, there is no longer an electrical connection between the shorted first electrode 406 and the segmented bus lines 407 that had been in electrical contact with the electrode. Therefore, the ablation of the first electrode transforms the short fault into an open fault, preventing any current from flowing through the shorted pixel. Furthermore, in the embodiment illustrated in FIG. 4, segmented bus lines 407 that had been connected to the first electrode 406 that was ablated are also electrically isolated, and thereby no current flows through these components either.

The ratio of short circuit current to the current during normal operation defines the sensitivity "S." This ratio indicates the tolerance that may be used in the fuse design and dictates the maximum fluctuation the fuse may experience before opening the electrical connection. For this exemplary embodiment shown in FIGS. 4(*a*)-(*d*), the sensitivity is:

$$S=I_{off}/I_{on}=n_{row}$$

Embodiments similar to the one depicted in FIGS. 4(*a*)-(*d*) that comprise segmented bus lines and/or where the first electrode of each OLED circuit element comprises a fuse may have the additional benefit of being fault tolerant in relation to shorts that may occur in other parts of the device, such as the bus lines. For instance, if a bus line 407 is shorted, the excess current that flows through that short may pass through the first electrode of only two OLED circuit elements. By choosing a thickness of the first electrodes 401 so that it ablates when $I_{off}=I_0/2$, the device may be tolerant to these faults as well. That is, if such a fault occurs, the fuses (i.e. the first electrodes 401) may ablate and thereby electrically isolate the shorted segmented bus line.

Second Exemplary Embodiment

FIGS. 5(*a*)-(*d*) show an exemplary embodiment of the first device that comprises islands of thick conductors 501 (e.g. segmented electrodes) further having a thin layer of conductor 502 and 506 disposed over the thick conductors 501, where the portions of the thin conductor 506 at the interconnects between the thick conductors are fuses. More specifically, FIG. 5(*a*) shows an embodiment of the first device in normal operation; FIG. 5(*b*) shows the cross-sectional view of this exemplary embodiment in normal operation; FIG. 5(*c*) shows the same embodiment of the first device after a fault has occurred; and finally FIG. 5(*d*) shows the cross-sectional view of this exemplary embodiment after a fault has occurred.

As was noted above, although reference may be made to a "thick" layer of conductive material (i.e. the electrode) and a "thin" layer of conductive material, the actual thickness of each of these components (and, correspondingly, the relative thickness of the two layers of conductive material) may depend on a variety of factors, including the material used for each layer. For example, in some embodiments the "thick" and the "thin" conductive layers may have approximately the same thickness (or the "thin" layer may even have a greater thickness than the "thick" layer), but the "thin" layer of conductive material may comprise a material that has a higher resistivity than the "thick" layer of conductive material. In other embodiments the "thick" and the "thin" conductive layers may have approximately the same thickness (or the "thin" layer may even have a greater thickness than the "thick" layer), but the "thin" layer of conductive material may comprise a material that has a lower melting temperature than the "thick" layer of conductive material. Thus, in the embodiments described below, reference could also be made to a "first" layer (in place of a "thick" layer) of conductive material and a "second" layer (in place of a "thin" layer) of conductive material to describe the exemplary structures. However, for illustration purposes only, reference may be made generally to a "thick" and a "thin" layer.

In addition, although an electrode (or electrodes) may be referred to as an "island," this does not require that each of these electrodes must be physically isolated from the other components of the device. For instance, each of the conductive "islands" may be connected to other components (including the electrode of one or more of the other pixels) by a component or components (such as a fuse), as would be understood by one of ordinary skill in the art. Thus, the reference to an "island" is simply intended to illustrate that each of these components comprises a physically separate component from one another (e.g. each island may form the electrode of one pixel). Each of these electrodes may be electrically isolated from each of the other electrodes if a short occurs in the pixel of that electrode by a fuse.

The exemplary embodiment depicted in FIGS. 5(*a*)-(*d*) comprises a second electrode 504 disposed over a substrate 503, an organic EL material 505 disposed over the second electrode 504, a first electrode 501 that is patterned and is disposed over the organic EL material 505, and a thin layer of conductive material 502 and 506 that electrically connects the patterned first electrode 501 of each pixel together. The patterned first electrode 501 of each pixel 500 may be a thick layer of conductive material. In this exemplary embodiment, the thickness of the thick 501 and the thin 506 conductive layers is the dimension of the layer that is disposed substantially along the axis that is perpendicular to the plane of the substrate 503. In some embodiments, the inventors have found that it may be preferred that the thick layer of conductive material 501 may have a thickness between approximately 10 nm and 500 nm and the thin layer of conductive material 502 and 506 may have a thickness between approximately 1 nm and 60 nm. However, in some embodiments, the inventors have found that the thick layer of conductive material 501 may have a thickness between approximately 5 nm and 1 um and still function for its intended purpose. In some embodiments, it may be preferred, as was described above, that the thick layer of conductive material 501 has a thickness that is at least twice as great as the thin layer of conductive material 506.

As depicted in FIG. 5 (*a*), the thin conductive layer may be unpatterned, and may comprise a portion 502 of a conducting layer that is disposed over the patterned first electrode 501 of each of the pixels 500, and a portion 506 that is disposed over an area of the first device that is between the OLED circuit elements. This portion of the thin layer of conductive material 506 that is disposed over the area between the OLED circuit elements may have properties such that it functions as a fuse. For instance, and as shown in FIGS. 5(c) and (d), this portion of the thin conductive layer 506 may have a thickness such that it ablates in response to an excess current, such as when a short circuit occurs. When excess current flows through the first electrode 501, the interconnect region 506 around the first electrode 501 may be ablated, thereby creating an open circuit 507 that electrically isolates the OLED circuit element where the short occurred. In some embodiments, it may be preferred that each of the OLED circuit elements comprises the thick layer of conductive material 501 and at least a portion of the thin layer of conductive material 502.

Figure 5A:
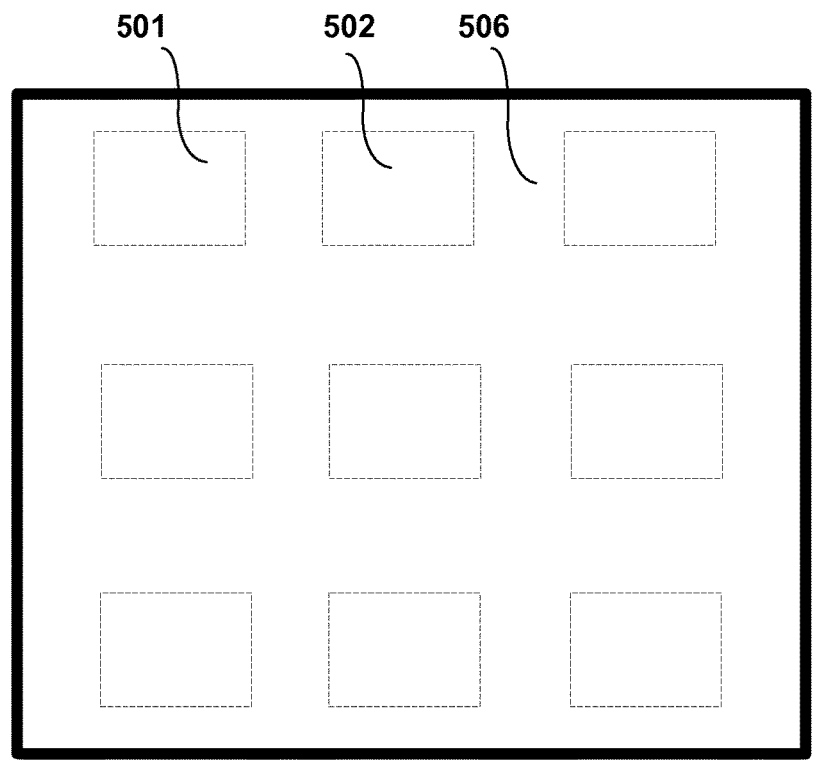
FIGS. 5(a) and (b) show a top view and a cross-section, respectively, of an exemplary OLED before a fault occurs in accordance with some embodiments.
Figure 5B:
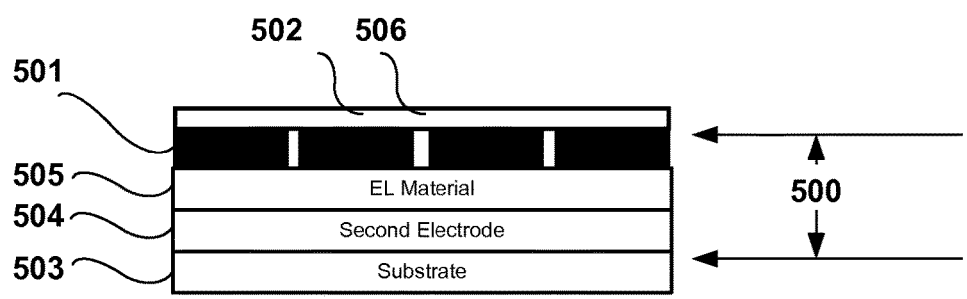
FIGS. 5(c) and (d) show a top view and a cross-section, respectively, of the exemplary OLED after a fault occurs in accordance with some embodiments.
Figure 5C:
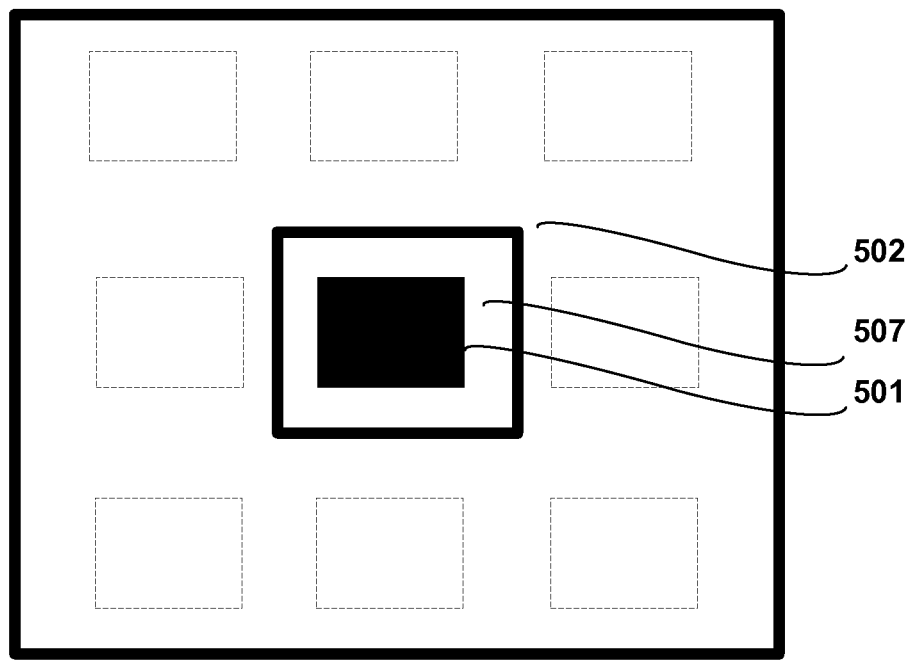
Figure 5D:
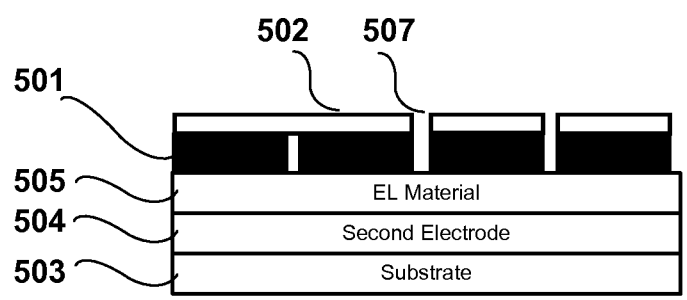

One example of a method to fabricate a device according to this exemplary embodiment may be to deposit the thick conductive islands 501 (preferably Al) followed by a thin blanket conductive layer 502 and 506, as shown in FIG. 5(b). In the normal operation mode, the thin conductive layer 502 and 506 will conduct the current from one conductive aluminum island 501 (i.e. the first electrode) to the next. However, when a potential short occurs, the current may be large enough that it will heat up the thin blanket layer at the inter-connect regions 506 so that these portions are ablated and thereby create an open circuit 507, as shown in FIGS. 5(c) and (d). Thus, the portion of the blanket layer that forms the interconnects 506 between the first electrode 501 of the pixels may comprise a fuse in this embodiment.

In some embodiments, instead of a blanket layer of thin conductive material, the thin layer of conductive material may be patterned to form the interconnects 506 between the first electrode 501 of the OLED circuit elements. In this embodiment, the thin conductive layer may not be disposed over any portion of the patterned first electrode 501 of the pixels 500, or may be disposed over only a portion thereof.

In the exemplary embodiment shown in FIGS. 5(a)-(d), the maximum current during normal operation in each row for this embodiment may be the same as in the first exemplary configuration: approximately $I_{on}=I_0/n_{row}$. However, because there are potentially as many as four fuses for each island of thick conductive material 501 (corresponding to the interconnect regions 507 between each first electrode 501), any excess current, such as a short circuit current, will be shared by as many as four connections 506 (this may be the worst case scenario because current may prefer one path rather than the others). Although some of the first electrodes 501 may have less than four interconnections based on their location within the first device, the first electrode 501 of many of the pixels 500 in these embodiments may have at least four interconnects 506. At each of these connections (i.e. the fuse) 506, the short circuit current may be approximately $I_{off}=I_0/4$. The sensitivity in this case can be calculated by:

$$S=I_{off}/I_{on}=n_{row}/4.$$

Some of the potential advantages of the first and second exemplary embodiments may include: (1) the embodiments may function properly irrespective of the location of the short in the device. That is, if a short occurs either under the patterned first electrode or occurs at the inter-connect between the first electrode of a plurality of OLED circuit elements, the proper fuse (or fuses) will burn (or otherwise open) and thus protect the rest of the area of the first device; and (2) the fuses may be disposed over the pixels, so any by-products generated from the burnt/ablated (or otherwise opened) fuse will remain outside of the OLEDs. It should be understood that this is not an exhaustive list of the benefits of these two embodiments. Some of the potential disadvantages of the first two exemplary embodiments may include: (1) the embodiments may create more resistive power losses due to Ohm's law (i.e. I (current)×R (resistance)) due to the higher resistance of the cathode based on the patterned first electrodes of the pixels, as well as the resistance of the fuses and the interconnects; (2) the sensitivity is relatively low when there is a small number of rows; and (3) a shadow mask may be required to deposit and pattern the first electrodes of the cathode; however, patterning the cathode through use of the shadow mask may lose the fill factor.

Another potential advantage that some of these embodiments may offer is that the resistance of the anode or cathode may be controlled based, at least in part, on the segmented first electrodes and the interconnects between them. This may make the panel more uniform because the cathode potential may be controlled to compensate for potential drops across the anode or vice-versa. When balanced, this may result in a more uniform potential on the OLEDs across the whole first device.

In general, when potential drops across the anode and cathode of a device are different, or when the potential drops in delivering charge from the power source to the anode and cathode of a device are different, it may result in a non-uniform current flow through the device and the device may emit light unevenly. That is, some portions of the device may emit more light than other portions. In some circumstances, it may be desirable to have a device that has an anode and a cathode with substantially the same sheet resistance, even if they comprise different materials with different resistivities. In some circumstances, it may be desirable to have a device where the potential drops in delivering charge from the power source to the anode and cathode of a device are substantially the same. This may be achieved by using the resistance of additional components such as bus lines or fuses to control the potential drops.

In particular, where an anode comprises a first material that has a first resistivity, and the cathode comprises a second material that has a second resistivity that is different than the first resistivity, embodiments may provide that additional components may be added, electrically connected, or other modifications may be made to either the anode, the cathode, or both the anode and the cathode such that their potential drops may be substantially equivalent. For example, the thicknesses of the anode and cathode layers may be used to control the sheet resistance of each electrode (e.g. if the resistivity of the cathode is twice that of the anode, then if the thickness of the cathode is also twice that of the anode, then the anode and cathode may have the same sheet resistance). In other embodiments, if the anode has an initial sheet resistance that is at least 50% different than the sheet resistance of the cathode, components may be electrically connected and/or other modifications may be made to either the anode, the cathode, or both so that the potential drops across the anode and cathode or in delivering charge to the anode and cathode are within approximately 10% of each other. In other embodiments, if the anode has an initial sheet resistance that is at least 100% different than the sheet resistance of the cathode, components may be electrically connected and/or other modifications may be made to either the anode, the cathode, or both so that the potential drops across the anode and cathode or in delivering charge to the anode and cathode are within approximately 50% of each other.

Uniform sheet resistance may be achieved in some instances by decreasing the equivalent sheet resistance of the anode or cathode that has the higher initial sheet resistance. For instance, a highly conductive material or bus line could be added or electrically connected to the more resistive material so as to match the sheet resistance of the less resistive material. Other embodiments may achieve this by increasing the sheet resistance of either the anode or cathode that has a lower initial resistivity. For instance, the anode or cathode may be pixilated by segmenting the material, and interconnects between the segments may increase or decrease the overall sheet resistance of the anode or cathode. The "equivalent sheet resistance" may refer to the measure of the sheet resistance of the patterned conductive layer integrated with various electrical connections. This may include, for example, the sheet resistance of electrodes, bus lines, fuses or any other components.

In this regard, in some embodiments, a device may comprise a first conductive layer that is patterned to form a plurality of physically segmented electrodes. The device may also comprise a second electrode that may, for instance, be common to a plurality of pixels. The patterned first electrodes may be electrically connected using any suitable electronic components including, by way of example, the use of one or more fuses and/or bus lines. In this manner, the plurality of patterned first electrodes that comprise the first conductive layer will have a first equivalent sheet resistance that is based, at least in part, on the material that comprises the first conductive layer, the dimensions of the pixilated electrodes, as well as the various electrical connections made between the electrodes of each pixel. Similarly, the second conductive layer may have a second equivalent sheet resistance that may be based on, for example, the material that comprises the second conductive layer, the dimensions of the second conductive layer, the electrical components (such as any bus lines) connected to the second conductive layer or portions thereof, and any other relevant factor. The various factors that determine the equivalent sheet resistance of the first conductive layer and/or the second conductive layer may be chosen such that first equivalent sheet resistance and the second equivalent sheet resistance may be within approximately 50% or more preferably within 10%. In this manner, the first device may be designed to emit a more uniform amount of light across the device. In some embodiments, the first equivalent sheet resistance and the second equivalent sheet resistance may be approximately equal. In some embodiments, the first conductive layer may comprise a material having a first resistivity and the second conductive layer may comprise a material having a second resistivity, where the first resistivity and the second resistivity are more than 10% different. In some embodiments, the difference between the first resistivity and the second resistivity may be at least 20%, 50%, or 100%. That is, for instance, the materials that comprise the first conductive layer and the second conductive may have substantially different resistivities. However, by choosing a the other parameters of the first conductive layer (such as a particular pixel configuration and/or size), as well selecting the electrical connections and/or components between each of the pixilated electrodes, the equivalent sheet resistance of the first conductive layer that comprises the plurality of first electrodes may be adjusted to compensate for the difference in resistivity between the first and second conductive layers and thereby achieve a more uniform appearance for the lighting device.

Third Exemplary Embodiment

FIGS. 6(a) and (b) show an embodiment of the first device that includes an insulator 602 and a top conductive layer 606. In some of these embodiments, the conductive island (i.e. the patterned first electrode) 601 is electrically isolated from a top conductive layer 606 except for a small portion 607. This small portion 607, which forms the electrical connection between the patterned first electrode 601 of the pixel 600 and the top conductive layer 606, may comprise the fuse.

More specifically, this exemplary embodiment shown in FIGS. 6(a) and (b) includes a second electrode 604 disposed over the substrate 603, an organic EL material 605 disposed over the second electrode 604, a first electrode 601 that is patterned and disposed over the organic EL material 605, and further includes a top conductive layer 606 and an insulating layer 602. The insulating layer 602 is disposed over a part of the first electrode 601 of each of the plurality of OLED circuit elements, and the top conductive layer 606 is disposed over the insulator 602. The fuse 607 electrically connects the first electrode 601 of each of the plurality of OLED circuit elements with the top conductor 606. Preferably, the fuse 607 comprises a part of the top conductive layer 606. The fuse 607 may comprise the same material as the top conductive layer 606 or they may comprise a different material.

The length of the fuse 607 (in this exemplary embodiment, the length is the dimension of the fuse that is along the axis that is perpendicular to the substrate 603—i.e. the direction of current flow), may be determined in-part by the thickness of the insulating layer 602. It may be preferred in some embodiments that the thickness of the insulating layer 602 is between approximately 50 nm and 5 µm. As described above, the length of the fuse 607 may be one of the properties of the fuse that determines the total resistance of the fuse (and thereby the current at which the fuse may open the electrical connection).

In this exemplary embodiment, where the flow of current through the fuse 607 is substantially perpendicular to the plane of the substrate 603, the fuse 607 may comprise a material(s) that may be a highly conductive metal, such as aluminum. This may be due in-part because the fuse 607 has an area such that it does not block a substantial amount of the active area (i.e. the emissive area) of the OLED circuit element and thereby need not be transparent. That is, for instance, because the fuse 607 may be made of a highly conductive metal, the cross-sectional area of the fuse 607 may be much smaller than when a TCO is used, but may still function as a fuse for a desired melting current. For example, the inventors have found that a 30 mA current may be able to blow out (i.e. open) a fuse comprising ITO with a cross-sectional area of approximately 3.6 µm$^2$ (30 µm×0.12 µm). In comparison, Vapor Transport Epitaxy (VTE) deposited aluminum may typically have a resistivity approximately 250 times less than ITO. If the melting current is the same (i.e. 30 mA) and the resistance of the fuse is fixed, the cross-sectional area of a fuse of this more conductive material may be reduced to 0.00072 µm$^2$ for a length of 50 nm, and 0.072 µm$^2$, for a length of 5 µm. Thus, the use of more conductive materials may enable the fuse 607 to be smaller, and thereby block less of the light emitted by the device.

In general, the third exemplary embodiment described herein may potentially provide for greater flexibility in the design of the fuse geometry than that provided in some of the other exemplary embodiments because, in part, there are fewer limitations on the preferred dimension of the fuse along the axis that is substantially perpendicular to the current flow direction.

In some embodiments, this exemplary embodiment of the first device may preferably be fabricated in the following way: (1) depositing islands of conductive materials (i.e.

segmented), which constitute the patterned first electrode 601; (2) depositing islands of insulating materials 602 (i.e. segmented), where the footprint of these insulating materials 602 are slightly smaller than that of the conductive islands 601 underneath; and (3) depositing a blanket layer of a top conductive layer 606, which is disposed across the first device. When the top conductive layer 606 is deposited, the conductive material may form electrical connections 607 to the conductive islands (i.e. patterned first electrodes) 601, thereby forming a vertical connection 607, as shown in FIG. 6(*a*). This connection can also be achieved by connecting the edge of the conductive island 601 to the top conductor 606.

Under normal operating conditions, a current flows through each pixel 600 to the cathode island (i.e. first electrode) of that pixel 601, and continues to the top conductive layer 606 through the vertical fuse 607. However, for instance when this pixel 600 is shorted, an excess current will cause the vertical fuse 607 to open the electrical connection 608, causing the cathode island 601 to be isolated from the top conductive layer 606, and thereby the rest of the first device. The sensitivity of this embodiment can be calculated as follows:

$$I_{on} = I_0/(n_{row} * n_{column})$$

$$I_{off} = I_0.$$

$$S = I_{off}/I_{on} = n_{row} * n_{column}$$

A few of the potential advantages of this exemplary embodiment may include: (1) the top conductive layer 606 may be highly conductive, so there may be minimum resistance between the first patterned electrodes 601; and/or (2) the sensitivity of this embodiment may be very high, which means there is a large tolerance in the fuse design and fabrication. Other advantages of this exemplary embodiment may also exist.

A potential disadvantage/challenge of this design is to pattern insulators 602 on top of OLEDs circuit elements, which may increase the complexity of the fabrication process. Another potential disadvantage that was noted with regards to some of the other exemplary embodiments is that a shadow mask may be used to pattern the layers, which may reduce the fill factor.

Fourth Exemplary Embodiment

FIG. 7(*a*) shows a top view of an exemplary embodiment of the first device. In this exemplary embodiment, the fuse 706 is incorporated at the electrode 701 that is closer to the substrate. In many such embodiments, this electrode 701 is the anode. This embodiment may permit the use of a photolithography process to fabricate the fine features required to realize the fuse structure 706. One example of the layout of a device implementing this embodiment is shown and described with reference to FIG. 8.

More specifically, and with reference to FIG. 7, in this exemplary embodiment of the first device the first electrode 701 is patterned and is disposed over the substrate (not shown), the organic EL material is disposed over the patterned first electrode 701, the second electrode is disposed over the organic EL material, and the first device further includes a bus line 702 disposed over the substrate. The patterned first electrode 701 of each of the plurality of pixels is electrically connected to the bus line 702 through at least one of the fuses 706. The patterned first electrode 701 of each of the plurality of OLED circuit elements may, in some embodiments, be fabricated in a single step with the fuses 706. That is, for instance, the patterned first electrode and the fuse may comprise the same (or substantially the same) material and/or may comprise the same (or approximately the same) thickness. As described in more detail above, using the same material for the first electrode and the fuse may not only decrease the manufacturing costs, but may also decrease the complexity of the manufacturing process because the fuse may have larger dimensions than embodiments where the fuse comprises the same material as the bus line. This may also provide a designer with more control of the selection of the attributes (such as dimension, position, and materials) of each component, particularly the bus line, which is generally preferred to reduce resistive power losses in the device. In addition, an insulating layer (not shown) may be disposed between each of the fuses 706 and the organic EL material. In some embodiments, the insulating layer may be disposed over the fuses 706, and the organic EL material may be disposed over the insulating layer. The insulating layer may prevent, or reduce the likelihood of, the EL material being damaged in the event that an excess current causes one of the fuses 706 to open, such as when a short circuit occurs.

In some embodiments, the insulating layer may form a grid layer over the substrate that defines the emissive area of the pixels. The grid layer may comprise a layer of insulating material that is disposed in the area of the device around (i.e. over) the fuses 706. In some embodiments, the insulating layer may be disposed over bus lines. Generally, fuse materials used in such embodiments may comprise, by way of example only, TCOs such as ITO or IZO. The cross-sectional area of the fuse 706 may be large enough to ensure sufficiently high conductivity, yet small enough to ensure sufficiently high transparency. Where the fuse 706 and electrode 701 are patterned of the same material, at substantially the same time, and to substantially the same thickness, some properties of the fuse 706 may be determined by parameters preferred for the first electrode 701 performance. For example, where it is desired that the electrode 701 is transparent, the fuse 706 material and thickness may be selected with this criteria in mind, and other fuse parameters such as the width may be used to ensure that the fuse 706 functions as a fuse (i.e. that it opens the electrical connection in response to a certain amount of current). A preferred range of the thickness of the fuse 706 in some embodiments is between approximately 30 nm and 300 nm.

In addition, in some embodiments, the ratio of the length of the fuse to the width of the fuse (where the width of the fuse is the dimension of the cross-sectional area that is not the thickness) may preferably be low enough such that the fuse 706 is conductive under normal operation, but is high enough to generate enough heat to burn (i.e. open) the fuse 706 upon the occurrence of an excess current. The inventors have found that a preferred range for the fuses may be such that the length-to-width ratio is between approximately 0.1 and 5.0. However, any length to width ratio that enables the fuse 706 to open an electrical connection in response to a desired excess current, such as a current that occurs in response to a short circuit, is contemplated as within this embodiment.

With continued reference to this exemplary embodiment and FIG. 7, a method to fabricate such a device for a bottom emission OLED with an anode made of a material such as ITO may include the step of defining the fuse feature 706 and anode pixel electrode 701 on an ITO coated substrate. As described above, the electrode 701 and the fuse 706 may be considered "integrally coupled" in such embodiments. A highly conductive metal bus line 702 may then be fabricated on the same substrate in a way such that the active ITO anode is connected to the bus line 702 through a narrow ITO channel, forming a fuse 706 at the pixel level, as shown in FIG. 7(*a*). Under normal operation, the current will travel across the panel through bus lines 702, and continue to the pixilated ITO anode electrodes: $I_{cm}=I_0/(n_{row}*n_{column})$. When, for instance, an ITO anode 701 is shorted (or an electrical short forms elsewhere in the device), the short may draw an excess current of approximately $(I_{off}=I_0)$ from the bus line 702, which will open the fuse, as shown in FIG. 7(*b*). By electrically isolating the shorted pixel 707, the current flow through the rest of the panel for light emission may be substantially maintained. The sensitivity of the fuses of this embodiment can be calculated as follows:

$$I_{on}=I_0/(n_{row}*n_{column})$$

$$I_{off}=I_0.$$

$$S=I_{off}/I_{on}=n_{row}*n_{column}$$

As noted above, while embodiments are not so limited, forming the fuse and the electrode of the same material (e.g. during the same manufacturing step) may provide for the utilization of fuses that have dimensions that are more readily and accurately fabricated, and thereby may be more likely to function as intended when fabricating commercial embodiments of such devices using typical equipment and processes. As noted above, if the fuse comprises a highly conductive material such as those that are generally used for bus lines, the thickness and/or width of the fuse would likely be required to be small enough such that the fuse will open the circuit in response to an excess current. The inventors have found that for some embodiments, this may require a thickness on the order of 10 nm or less and/or have a relatively large length-to-width ratio (e.g. on the order of 50:1 in some instances) particularly if the thickness of the fuse is approximately equal to the thickness of the conductive bus line (which may be the case if each component is manufactured in the same step). However, the exact dimensions of the fuse, as noted above, may be determined based on the specific application for the device, as well as the materials and components utilized therein.

Some of the potential advantages that embodiments of such devices may have include: (1) that such embodiments may offer high sensitivity; (2) that this embodiment may be easy to fabricate; and (3) that some embodiments may achieve higher fill factor through the utilization of photolithography or similar process.

Furthermore, some embodiments may have a low resistive loss due to the fact that the fuse in certain embodiments may be very small (e.g. when the pixel is also small). For example, a typical OLED white pixel (without outcoupling) may have a luminance of 2160 cd/m$^2$ at 4.25 mA/cm$^2$ and 4.21 V. When the active pixel (i.e. the emissive area of the pixel) has a surface area of 1 mm$^2$, the current through the pixel is approximately 0.0425 mA. In some embodiments where the fuse may be designed into a square shape and a material such as ITO is used with 15 Ohm per square sheet resistance, the voltage drop $V_{fuse}$ on this fuse can be calculated as:

$$V_{fuse}=\text{Current}(I)*\text{Resistance}(R)=4.25\times10^{-5}\text{ A}*15\text{ ohm}=6.4\times10^{-4}\text{ Volt}$$

Other materials and geometric shapes may be used to construct the fuse. The inventors have found that, when compared to the typical 4.21 V on an OLED, this smaller voltage associated with the fuse may be considered negligible. With an exemplary 1 cm by 1 cm pixel, the potential drop on the fuse will be approximately 0.064 V, which is only 1.5% of the voltage on the OLED.

FIG. 8 shows a representative layout of a WOLED light panel, where the fuses 801, bus line 803, and first patterned electrodes 804 are shown. The inventors have experimented with this particular embodiment of a first device by fabricating a WOLED lighting panel based on a pixilated lighting panel layout that incorporated the exemplary fuse designs described above, as shown in FIG. 8. For each fuse 801, the dimension of the fuse along the current flowing direction is defined as L, the dimension of the fuse that is not the thickness and is not disposed along the direction that the current is flowing is defined as W, as shown in the blown-up view of a fuse 802.

In general, there were four different geometry designs of fuses comprising 120 nm-thick ITO (note that the thickness of the fuse in this embodiment is the dimension of the fuse that is disposed substantially perpendicular to the plane of the substrate) that were tested by the inventors. The dimensions and corresponding resistance and estimated melting current of which are listed in Table 1:

TABLE 1

| Experimental Fuse Design Characteristics | | |
|---|---|---|
| L × W (μm × μm) | Resistance (ohm) | Melting current (mA) |
| 15 × 40 | 0.375 $R_{s\_anode}$ | 20 |
| 15 × 30 | 0.5 $R_{s\_anode}$ | 15 |
| 15 × 20 | 0.75 $R_{s\_anode}$ | 10 |
| 20 × 25 | 0.8 $R_{s\_anode}$ | 15 |

Figure 9:
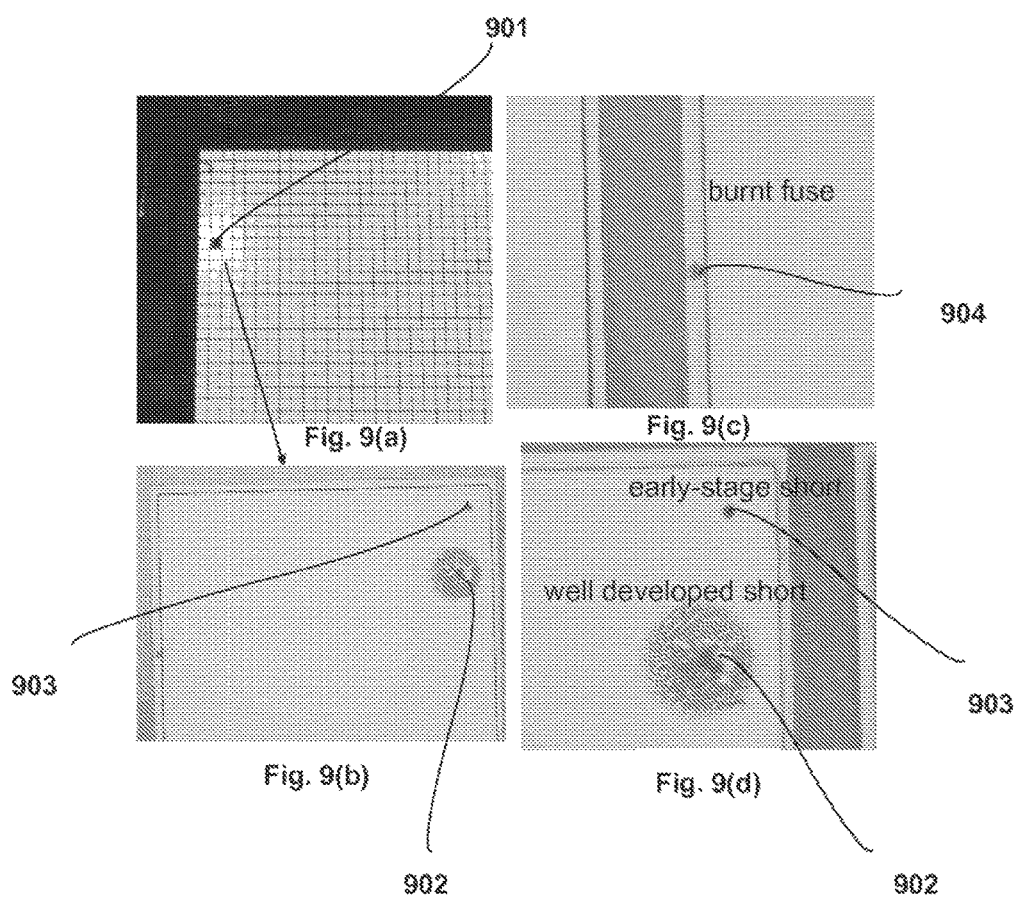
FIGS. 9(a)-(d) comprise photographs of experimental results for the implementation of an exemplary embodiment.

FIG. 9 shows experimental results of an experimental WOLED panel that utilizes this exemplary embodiment. FIG. 9(*a*) shows the microscopic image of a completed plate with one single pixel shorting 901. The pixel 901 is enlarged in FIG. 9(*b*), which shows both an early-stage short 903 and a well developed short 902. The opened fuse 904 is clearly shown in FIG. 9(*c*). FIG. 9(*d*) shows a magnified image of the early-stage short 903 and well-developed short 902. Based on factors such as the size and shape of the shorting spot, it can further be determined whether this is an early stage shorting or a well-developed shorting (as indicated in FIG. 9(*d*)).

Figure 10:
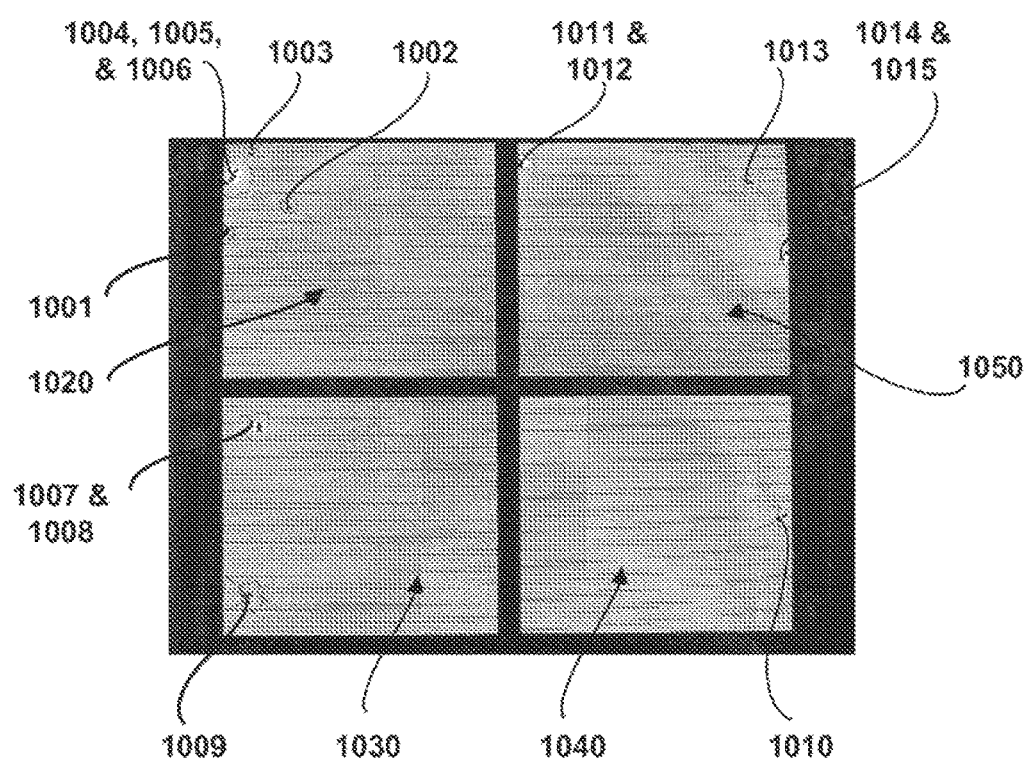
FIG. 10 shows experimental results of an exemplary OLED panel that comprises shorted pixels in accordance with some embodiments.
Figure 11:
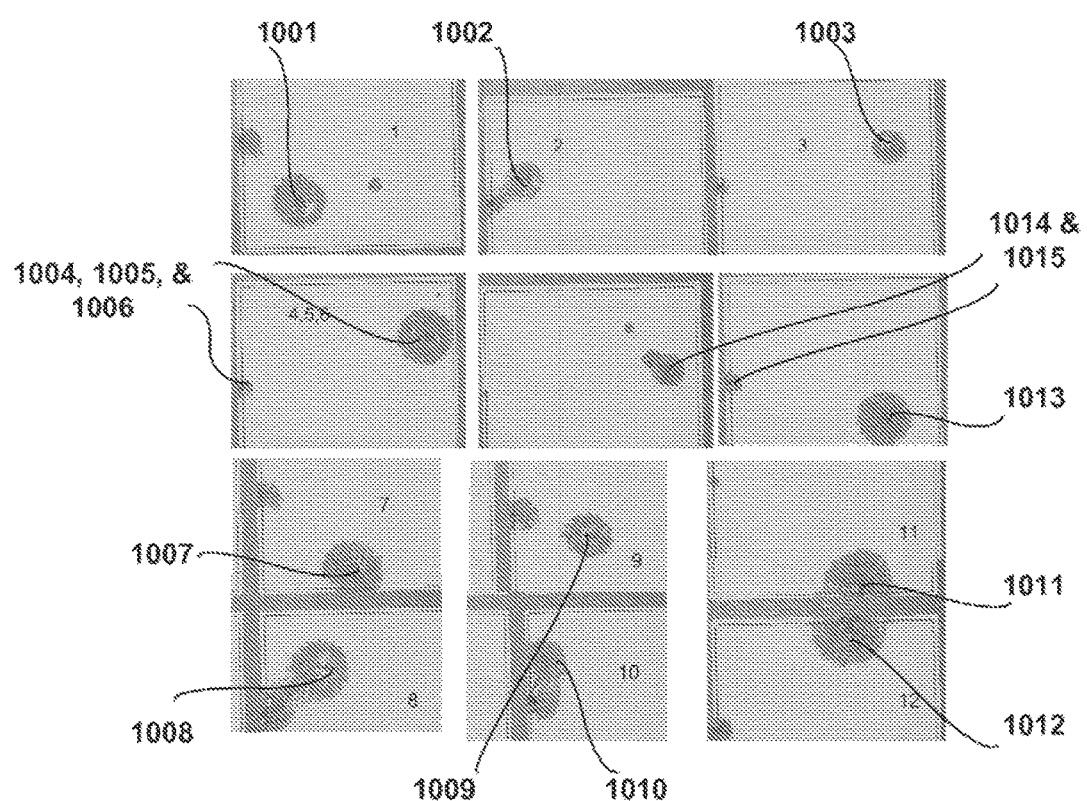
FIG. 11 shows microscopic images of the experimental results from the exemplary OLED panel shown in FIG. 10 having shorted pixels in accordance with some embodiments.

FIG. 10 shows the same WOLED panel shown in FIG. 9 after a short-acceleration process. The dimensions given for the fuses on each quarter of the panel correspond to the values listed in Table 1. In particular: quarter 1020 has fuses with length-to-width dimensions 15 μm×20 μm, and a melting current of 10 mA; quarter 1030 has fuses with length-to-width dimensions 15 μm×30 μm and a melting current of 15 mA; quarter 1040 has fuses with length-to-width dimensions 15 μm×40 μm and a melting current of 20 mA; and finally quarter 1050 has fuses with length-to-width 20 μm×25 μm and a melting current of 15 mA. The melting current indicated for the fuses of each quarter is the current at which the fuse is designed to open an electrical connection. The dark spots labeled with numbers 1001 through 1015 are spots where shorts occurred in the device and where the fuse opened to electrically isolate the shorted pixel. The microscopic images of shorting pixels marked in FIG. 10 are shown in FIG. 11, where each of the shorts labeled 1001-1015 correspond to one another. That is, shorts 1001-1006 are from panel 1020; shorts 1007-1009 are from panel 1030; short 1010 is from panel 1040; and shorts 1011-1015 are from panel 1050.

Fifth Exemplary Embodiment

FIGS. 12(a)-(d) shows an exemplary embodiment wherein an integrated bus line is utilized. More specifically, FIG. 12(a) shows the embodiment of the first device in normal operation; FIG. 12(b) shows a cross-sectional view of this exemplary embodiment in normal operation; FIG. 12(c) shows the same embodiment of the first device after a fault has occurred; and finally FIG. 12(d) shows a cross-sectional view of this exemplary embodiment after a fault has occurred.

In this exemplary embodiment, the cathode is divided into small islands, wherein the small islands comprise the first electrodes 1201 of a plurality of OLED circuit elements. The first electrode 1201 of each of the OLED circuit elements may also be the fuse. An interconnected bus line layer 1202 may be disposed over and/or between the first electrodes 1201 of the OLED circuit elements, as shown in FIG. 12(a).

More specifically, in this exemplary embodiment of the first device, the second electrode 1204 is shown as being disposed over the substrate 1203, the organic EL material 1205 is disposed over the second electrode 1204, the first electrode 1201 is patterned and is disposed over the organic EL material 1205, and the first device further includes an integrated bus line 1202. The integrated bus line 1202 electrically connects the first electrode 1201 of each of the OLED circuit elements together. The first electrode 1201 of each of the plurality of OLED circuit elements may also comprise a fuse. Preferably, in some embodiments, the first electrode 1201 is ablated in response to a short circuit (i.e. the excess current that results from the short circuit). This is shown in FIGS. 12(c) and (d) where the first electrode 1206 is shown as having been ablated, thereby opening the electrical circuit. In some embodiments, the integrated bus line 1202 may be disposed over and/or between the plurality of OLED circuit elements (or a portion thereof, as shown in FIG. 12(b)).

Figure 13A:
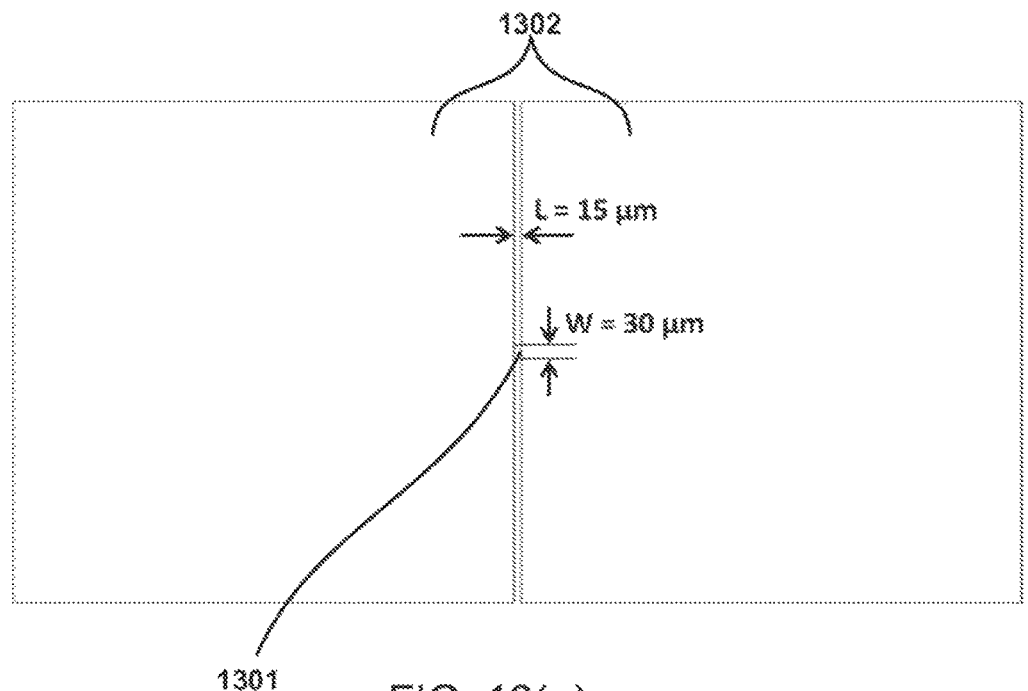
FIGS. 13(a) and (b) are illustrations of single fuse and multi-fuse experimental configurations, respectively, in accordance with some embodiments.

According to some embodiments, when a short is developed in the first electrode 1201 of one of the OLED circuit elements (e.g. the electrode 1206 shown as the 4$^{th}$ row, 3$^{rd}$ column in FIG. 12(c)), the excess current will ablate the thin cathode island 1206 and stop the current flow through this pixel. Some of the potential advantages of this exemplary embodiment may include (1) high sensitivity; and (2) because the first electrodes 1201 are isolated from each of the other first electrodes, a shot will only cause ablation in one thin cathode island (e.g. the first electrode 1206 shown in FIGS. 12(c) and (d)), and may not affect neighboring islands. The sensitivity ("S") of this embodiment may be calculated as follows:

$I_{on}=I_0/(n_{row}*n_{column})$ $I_{off}=I_0.$ $S=I_{off}/I_{on}=n_{row}*n_{column}$ Experimental Fabrication and Results Exemplary fuses with different geometric designs were investigated, and the relationship between geometric dimension and melting current was further studied by the inventors. For these exemplary devices, testing layouts were designed and 800 Å ITO was patterned into two 1 mm×1 mm contact pads 1302 with one or multiple narrow bridges in between which will function as the fuse 1301. FIGS. 13(a) and (b) show the layouts of the testing pattern with one L×W=15 μm×30 μm fuse 1301 and three L×W=15 μm×10 μm fuses 1301, where L is the length along the current flow direction and W is the width perpendicular to the current flow direction. Table 2 below lists all the designs utilized in this experiment with various L and W values used in this test. It should be noted that the numbers of L and W used in this example are the designed dimensions, whereas the fabricated fuse may have different dimensions based on the fabrication process.

TABLE 2

| Dimensions of fuses in the testing panel | | | | | |
|---|---|---|---|---|---|
| L [μm]  10 | 15 | 20 | 25 | 25 | 25 |
| W [μm] 10 | 15 | 20 | 25 | 30 | 40 |

Figure 14:
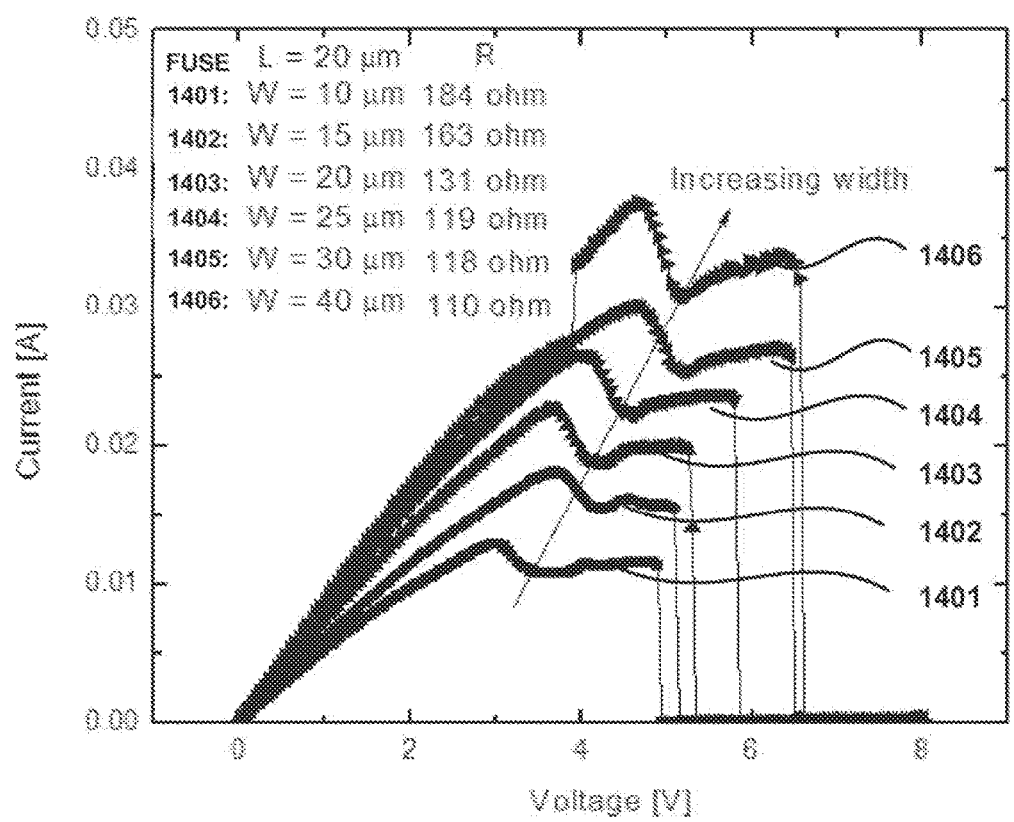
FIG. 14 is a graph of current vs. voltage for exemplary fuse designs comprising ITO.

Current-voltage IV characteristics of the experimental fuses were tested using an Agilent 4155C Semiconductor Parameter Analyzer, which is commercially available. FIG. 14 shows an example of the IV curves of a set of fuses with the same length L=20 μm, and various widths W from 10 μm to 40 μm. The voltage was applied to the contact pads 1302 and swept from 0 V to 8 V. The resistances of the fuses were extracted from a low voltage sweep from approximately −0.05 V to 0.05 V, as listed in the graph next to the width values (e.g. fuse 1401 has width=10 μm and resistance=184Ω; fuse 1402 has width=15 μm and resistance=163Ω; fuse 1403 has width=20 μm and resistance=131Ω; fuse 1404 has width=25 μm and resistance=119Ω; fuse 1405 has width=30 μm and resistance=118Ω; and fuse 1406 has width=40 μm and resistance=110Ω).

As shown in FIG. 14, the fuses function similar to a resistor in the beginning (i.e. at low voltages) and the current rises almost linearly dependent on the voltage. At a certain voltage, the current reaches a peak value and then drops, followed by a much gentler (i.e. gradual) IV slope, which implies an increasing of the fuse resistance. With continued reference to FIG. 14, after a short period of continuous biasing, the current drops to zero, indicating that the fuse is fully open and has created an open circuit. As defined above, the maximum fuse current is the "melting current" $I_M$.

As shown in FIG. 14, it was also found that with an increase of fuse width, the melting current $I_M$ is also increased (i.e., the melting current for fuse 1406 is greater than for fuse 1405, which is greater than for fuse 1404, etc.). This is may be due in part to fact that the normal resistance of the fuse at room temperature (R) is inversely proportional to the width W. Therefore the wider the fuse (i.e. the larger W is), the lower the resistance, and the higher the current that may be required to generate enough Joule heat ($I^2R$) to burn, melt, ablate, crack or otherwise physically or chemically alter the material and open up the fuse.

Figure 15:
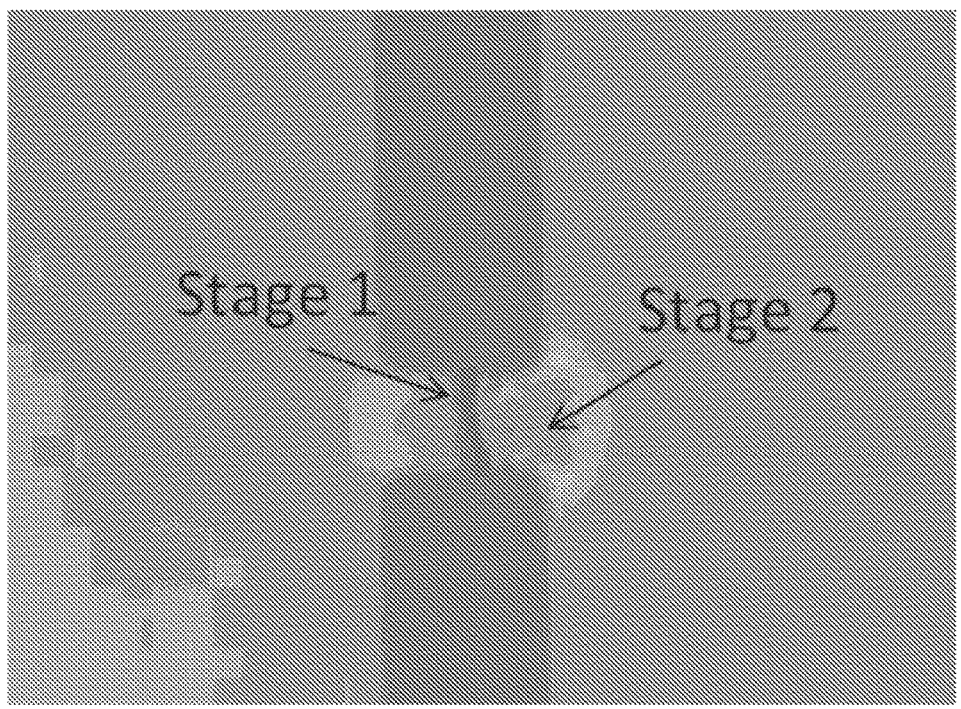
FIG. 15 is a microscopic view of a burnt fuse in accordance with some embodiments.
Figure 16:
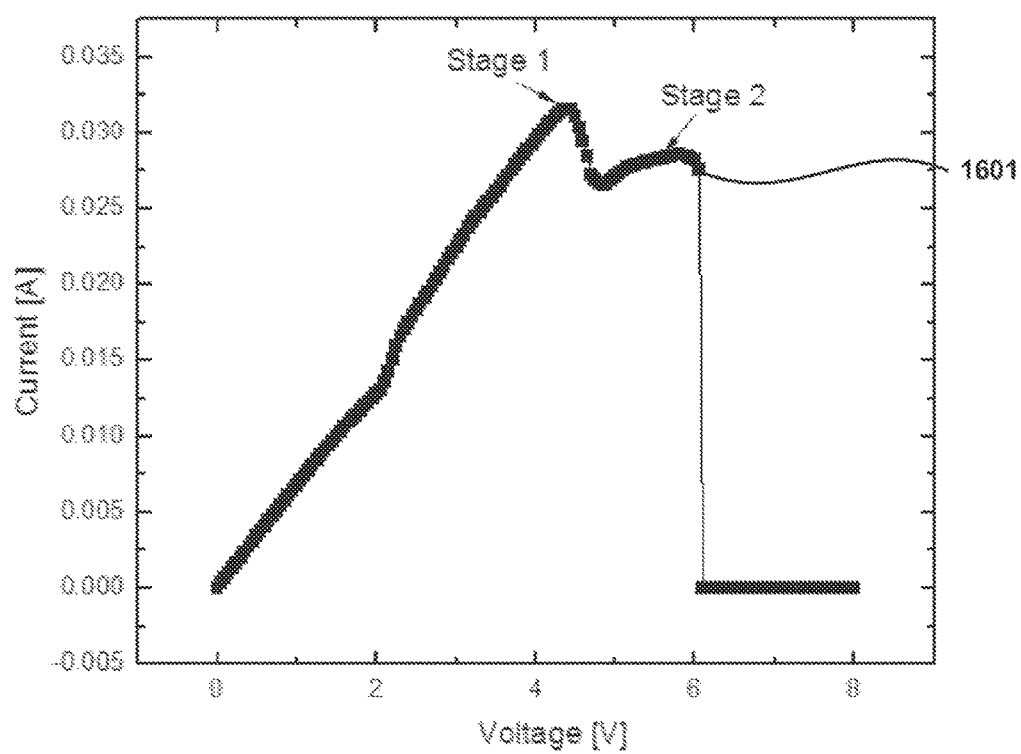
FIG. 16 is a graph of current vs. voltage for an exemplary fuse design in accordance with some embodiments.

The inventors have also found that the breaking down of an ITO fuse may comprises two or more stages, as indicated in FIG. 15: one or more physical cracks may be formed in Stage 1, and the fuse material may be burned in Stage 2, the combination of which causes the ultimate opening of the fuse. A potential explanation for these states is as follows: in Stage 1, normal current I flows through the fuse having a resistance R (initially functioning as a resistor) and generates Joule heating (equal to $I^2R$), which heats up the material of the fuse. One or more cracks may then develop because of the compressive strain caused by the mismatched thermal expansion coefficient (CTE) of thin film ITO ($10.2 \times 10^{-6}$/° C.) (see, e.g. D. G. Neerinck and T. J. Vink, *Depth Profiling of Thin ITO Films By Grazing Incidence X-ray Diffraction*, Thin Solid Films, 278, 12 (1996), which is hereby incorporated by reference in its entirety) and glass substrate (37.8× $10^{-7}$/° C.) (see, e.g., D. Bhattacharyya and M. J. Carter, *Effect of Substrate On The Structural and Optical Properties of Chemical-Bath-Deposited CdS Films*, Thin Solid Films, 288, 176 (1996), which is hereby incorporated by reference in its entirety). Even with one or more cracks, the thin film may not be completely discontinuous, but the resistance of the fuse may rise dramatically, and hence generate more heat when current flows through the fuse so as to burn the material in Stage 2. This is correspondent to the IV curve of a typical ITO fuse shown in FIG. 16, where during Stage 1, the current reaches the peak value just before the cracking of the fuse occurs, and then the current falls into Stage 2 (i.e. at a lower level of current) for a short period of time until the fuse is open (i.e. at the melting current of the fuse 1601).

Figure 13B:
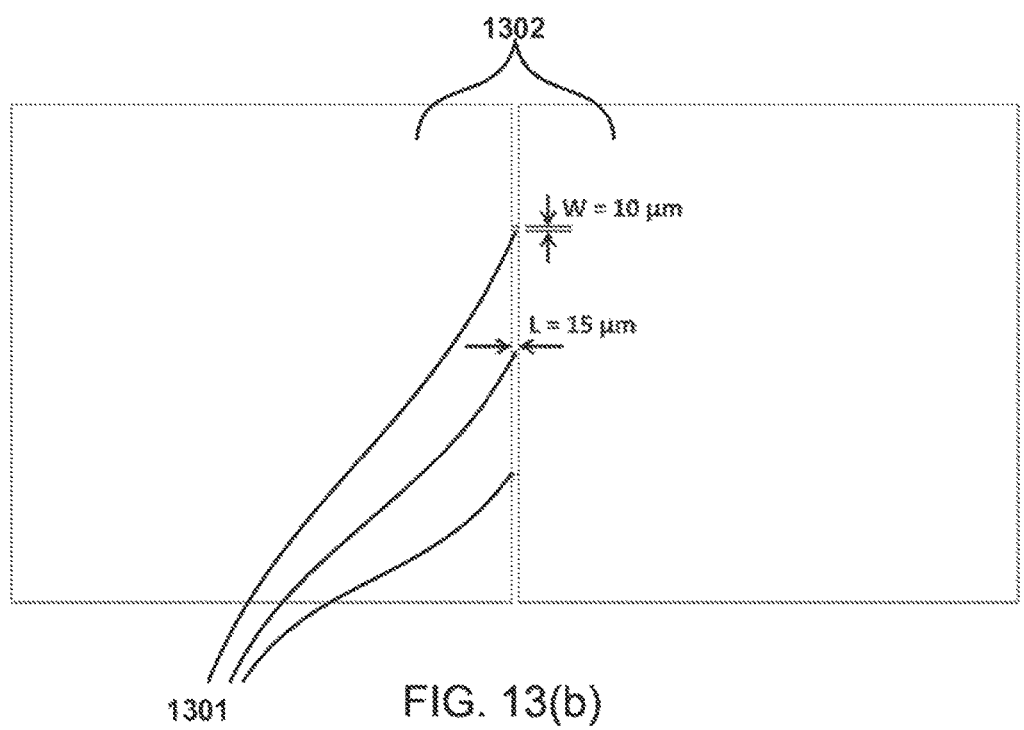

The inventors also studied multiple-fuse structures. Generally, under the same bias condition, a resistor with a width W has the same resistance as n resistors connected in parallel each having a width of W/n. For example, a single fuse with L×W=15 μm×30 μm in FIG. 13(*a*) is electrically equivalent to the three fuses with L×W=15 μm×10 μm in FIG. 13(*b*), as far as its resistance. However, due to process limitations (i.e. real world conditions that may result in fabrication errors or imperfections), the ITO layer may typically be over-etched, which may result in fuses with longer L and narrower W than those that are designed. The difference between the designed value and the real value may be defined as ΔL and ΔW. Table 3 below compares ΔW caused by the process limitation for various widths found by the inventors during the experiments.

TABLE 3

Comparison of ΔW at various width values

| Designed W [μm] | 10 | 15 | 20 | 25 | 30 | 40 |
|---|---|---|---|---|---|---|
| Measured W [μm] | 8 | 13 | 15 | 20 | 24 | 33 |
| ΔW [μm] | 2 | 2 | 5 | 5 | 6 | 7 |

Figure 17:
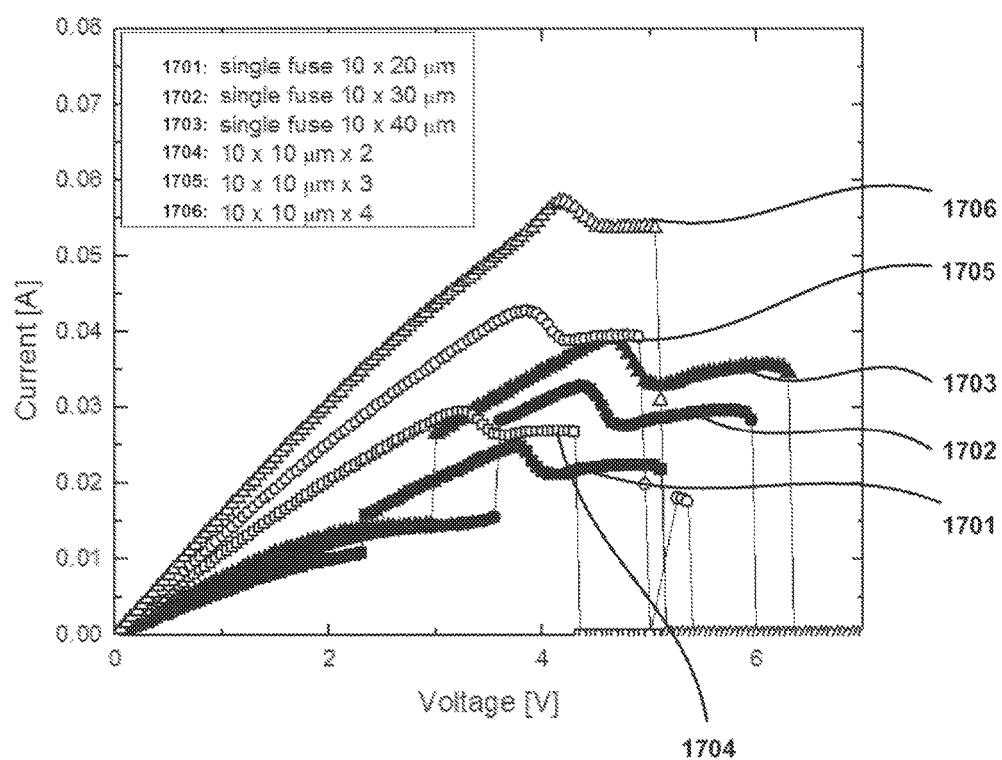
FIG. 17 is a graph of current vs. voltage for exemplary single fuse and multi-fuse designs in accordance with some embodiments.

IV curves of single fuses vs. multiple fuses plotted in FIG. 17, where the IV slopes (representing the resistance values) of multiple fuses (i.e. graphs 1704, 1705, and 1706) are steeper than those of single fuses (i.e. graphs 1701, 1702, and 1703). The multiple fuses also burn at a higher current than equivalent single fuses. That is, for instance, fuses 1704 (comprising two designed 10×10 μm fuses) burns at a higher current than fuse 1701 (comprising a single designed 10×20 μm fuse); fuses 1705 (comprising three designed 10×10 μm fuses) burns at a higher current than the fuse 1702 (comprising a single designed 10×30 μm fuse); and fuses 1706 (comprising four designed 10×10 μm fuses) burns at a higher current than the fuse 1703 (comprising a single designed 10×40 μm fuse). One possible explanation of this is that heat may be dissipated more readily in multiple smaller fuses than in a single larger fuse. Using multiple fuses may be advantageous in some applications when it is desired that the fuse be capable of sustaining a high current surge without opening the electrical circuit. In addition, the inventors also found that the burning procedure of multiple fuses is smoother than that of a single fuse, where usually abrupt current rise occurs during the voltage sweep. This can also be seen in FIG. 17.

Figure 18:
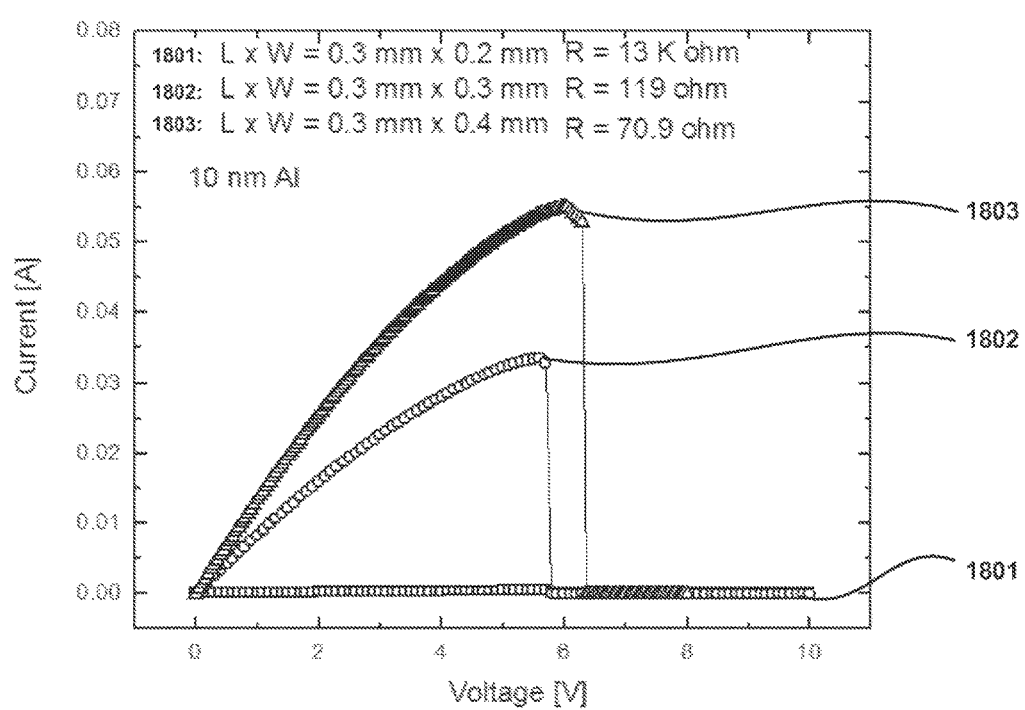
FIG. 18 is a graph of current vs. voltage for exemplary fuse designs comprising Al.
Figure 19:
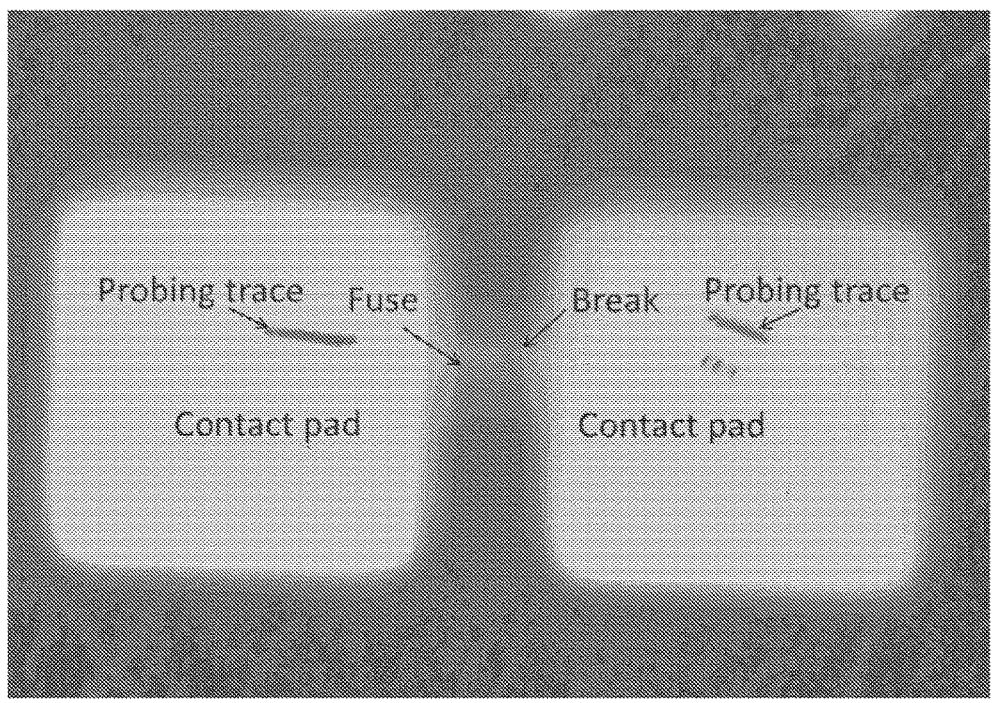
FIG. 19 is a microscopic view of a burnt fuse between two contact pads in accordance with some embodiments.

The inventors have also experimented by using different types of metal for various fuse applications. FIG. 18 shows the IV curves of 10 nm-thick aluminum (Al) fuses, with various geometric designs. Similar to the ITO fuses, generally the wider the Al fuse, the lower the resistance and the higher the melting current. However, the inventors found that the Al fuses show a very sharp instant breakdown, instead of a two-stage process as observed with ITO fuses. A clear break was found in the open fuse, as can be seen in FIG. 19. This may be due, in part, to the thin film Al having a higher coefficient of thermal expansion (CTE) (e.g. greater than $15 \times 10^{-6}$/° C.) than ITO (see, e.g. W. Fang and C.-Y. Lo, Sensors and Actuators, 84, 310-314 (2000), which is hereby incorporated by reference in its entirety). Therefore, the Al fuses may be easier to break on a glass substrate. In addition, Al has a lower melting point (approximately 933 K) than that of ITO (approximately 1800-2200 K), and the melting point further reduces when the film thickness is decreased.

Figure 20:
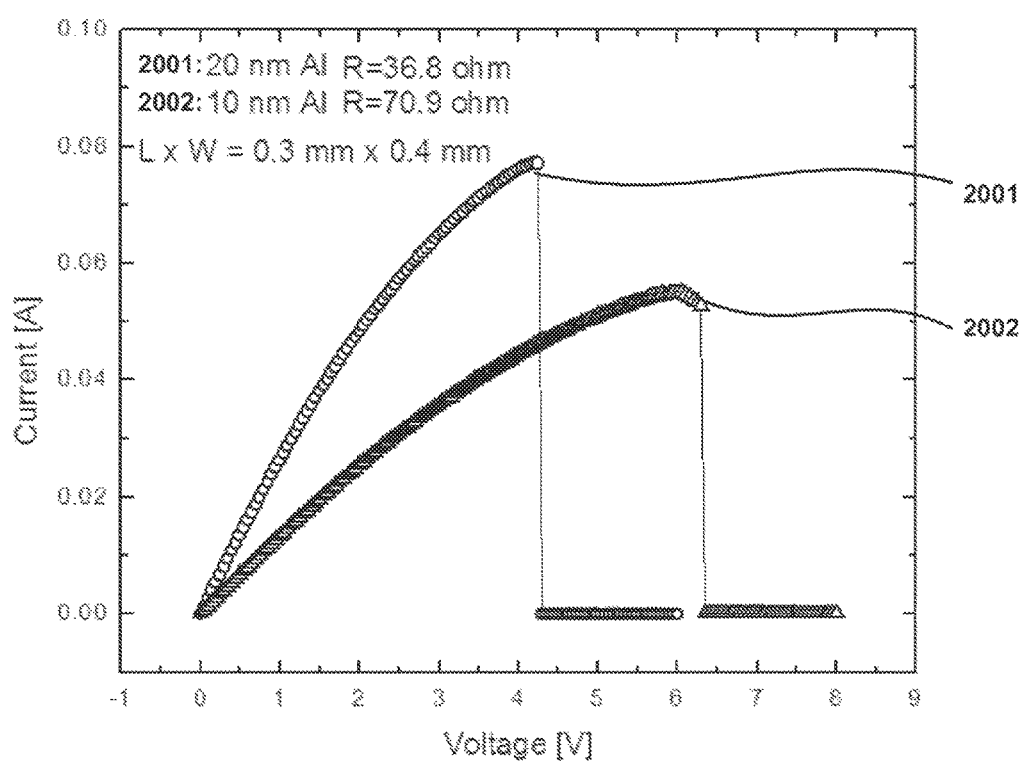
FIG. 20 is a graph of current vs. voltage for exemplary fuses having different thicknesses in accordance with some embodiments.

The inventor also experimented with Al fuses with different thicknesses, as shown in FIG. 20. The IV comparison of the same L×W=0.3 mm×0.4 mm fuses made from 10 nm (plot 2002) and 20 nm (plot 2001) Al were plotted in FIG. 20. With a film thickness twice as large, the resistance of the 20 nm-thick fuse 2001 was approximately half of the resistance of the 10 nm-thick fuse 2002, resulting in a higher melting current.

The general design rules developed by the inventors for incorporating fuses in a lighting panel are described below for exemplary purposes only. First, the working condition of the lighting panel may need to be determined, which usually refers to the desired luminance levels. Based on the current density-voltage-luminance (JVL) relationship, the driving condition at designated luminance levels may be determined. If the panel is designed to be dimmable, which means the panel may work at various luminance levels (e.g. from 500 cd/m$^2$ to 5000 cd/m$^2$), the working condition may also vary according to the luminance. In this exemplary case, minimum ($I_{min}$) and maximum ($I_{max}$) total panel current may be determined based on the lowest and highest luminance levels (assuming a constant-current driving configuration). For example, assuming the panel has n pixels that have the same (or approximately the same) emissive areas and device structures, the total panel current may be approximately equally divided, and each pixel will then have the minimum and maximum pixel current of approximately $I_{min}$/n and $I_{max}$/n. The rated current $I_N$ (i.e. the maximum current that a fuse can continuously conduct without interrupting the circuit), may be equal to approximately $I_{max}$/n.

In general, the melting current (IM) of the fuse should be greater than the maximum pixel current (e.g. $I_{max}$/n), yet lower than the minimum panel current (e.g. $I_{min}$). The fuses may be designed to open either at a low or high current level depending on the specification of the panel and/or the application it is intended to be used for. For example, $I_M$ (the melting current) may be set at a relatively low point closer to $I_{max}$/n, so that any excess current greater than the rated current will open up the fuse. In such circumstances, if a short develops (or begins to develop) in a pixel, the fuse may burn very quickly and isolate the shorting pixel from the normally operating ones, which may prevent the accumulation of local heating and safely protect the rest of the panel. This approach may favor an initial panel screening process, where any potential shorting is preferred to be detected and eliminated as fast as possible. On the other hand, in some embodiments, $I_M$ may be designed at a relatively high current level closer to $I_{min}$, so that the circuit can sustain some degree of excess current surge without shutting off any normally operating pixels.

Figure 21:
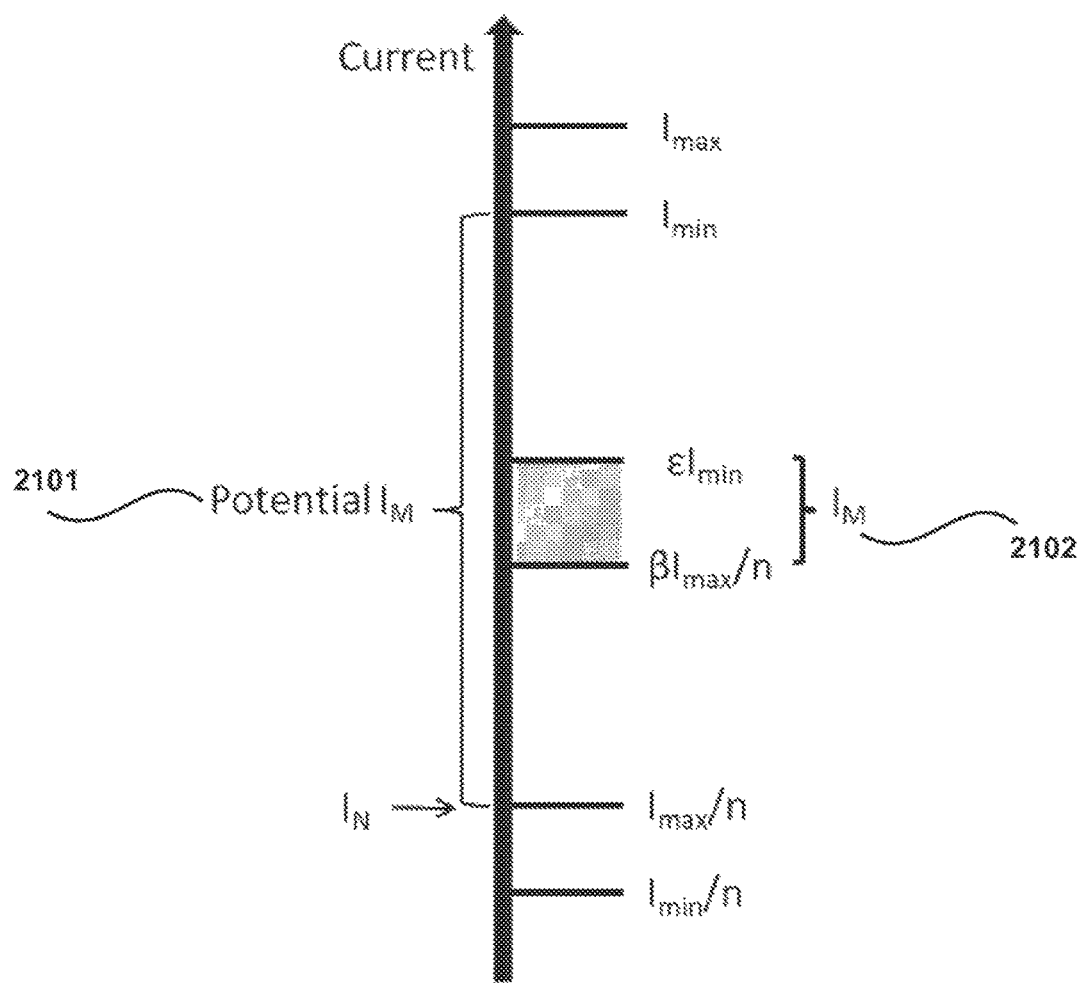
FIG. 21 is a graphical illustration of the different currents of an OLED, including exemplary values for melting currents $I_m$ of a fuse in accordance with some embodiments.

In general, there may be various ways to choose the melting current $I_M$ based on a customized specification. In practice, instead of setting $I_M$ right at $I_{max}$/n or $I_{min}$, the melting current may typically be set somewhere above $I_{max}/n$ and/or somewhere below $I_{min}$ so as to leave some tolerance (e.g. this will permit some initial increase in current or fluctuation). For example, with the opening of fuses (e.g. during operation of embodiments that may comprise fuses connected in series with each pixel), the total pixel number n decreases dynamically, which results in the increasing of the current supplied to each pixel based on $I_{max}/n$. Therefore, more tolerance may be needed above the current $I_{max}/n$, to avoid electrically isolating normally operating pixels when the total number of pixels goes down. In some embodiments, $I_M$ may be designed as $\beta(I_{max}/n)$, where $\beta$ is greater than 1. In some embodiments, $I_M$ may be designed as $\varepsilon(I_{min})$, where $\varepsilon$ is less than 1. In some embodiments, $I_M$ may be designed to fall within a range of $[\beta(I_{max}/n), \varepsilon(I_{min})]$. FIG. 21 provides a graphical illustration of the relationship of the currents described above, where the region 2101 refers to the values of the melting current of the fuses that may be selected such that the device may function properly, and the shadow region 2102 represents the designated $I_M$ for a particular embodiment. For instance, a melting current may be set at two times greater than the maximum pixel current, i.e., $\beta=2$, and $I_M \geq 2 \cdot (I_{max}/n)$. If the maximum panel current $I_{max}=200$ mA, and the total number of pixels n=20000, then the melting current $I_M \geq 2 \times (200/20000$ mA$)=20$ mA.

Once the range of melting current has been determined, the resistance range of the fuse may be accordingly determined, and the additional resistive power loss may then be evaluated. Given the working condition, the current density J of the panel can be determined as well as the current going through each pixel $I_{pixel}=J \cdot A$, where A is the emissive area of each pixel (assuming all pixels are of the same size). The potential drop due to the fuse resistor is given by $\Delta V = J \cdot A \cdot R$, and the power loss is $\Delta P = (J \cdot A)^2 \cdot R$. According to the exemplary design specifications, R may be further refined to a desired value to meet the requirement of $\Delta V$ and/or $\Delta P$. Continuing with the above example, where the maximum pixel current $I_{pixel}=200/20000$ mA=0.01 mA. With reference to FIG. 14, an 800 Å ITO fuse 1403 with L×W=20 μm×20 μm, and resistance R=131Ω, can open at approximately $I_M$=22.5 mA, which is within the range of the desired melting current. In this exemplary case, the potential drop across the fuse $\Delta V=0.01$ mA×131Ω≈0.00131 V, and the power loss due to the fuse resistor is approximately $\Delta P=(0.01 \times 10^{-3})^2 \times 131\Omega = 1.31 \times 10^{-5}$ mW. This also illustrates that the use of fuses does not necessarily introduce much power loss, which may be largely due to the low current level going through each fuse toward the pixel during normal operation.

After the melting current and resistance are determined for the fuse, the geometric shape and the material of the fuse can be decided according to the experimental results, in association with the process capability.

In combination with the use of fuses, an additional protecting circuit may be designed to provide feedback on current and/or voltage of the panel so as to control the speed of opening fuses. For example, under constant-current driving configuration, when a short occurs, the voltage will drop accordingly. The protecting circuit may be designed to detect the decrease of voltage and return a higher current pulse so that the fuse connecting to the problematic pixel can open quickly without accumulating too much heat, thereby protecting the OLED from any resulting damage/degradation, particularly the EL material.

CONCLUSION

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Although many embodiments were described above as comprising different features and/or combination of features, a person of ordinary skill in the art after reading this disclosure may understand that in some instances, one or more of these components could be combined with any of the components or features described above. That is, one or more features from any embodiment can be combined with one or more features of any other embodiment without departing from the scope of the invention.

As noted previously, all measurements, dimensions, and materials provided herein within the specification or within the figures are by way of example only.

A recitation of "a," "an," or "the" is intended to mean "one or more" unless specifically indicated to the contrary.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

The invention claimed is:
1. A method for producing a device comprising:
providing a substrate having a first conductive layer disposed thereon;
defining a plurality of physically segmented first electrodes on the first conductive layer,
defining a plurality of fuses on the first conductive layer;
fabricating a bus line on the substrate;
electrically connecting each of the plurality of physically segmented first electrodes to the bus line through the fuses;
after fabricating the bus line, depositing an organic EL material over the first electrodes; and
depositing a second electrode over the organic EL material.
2. The method of claim 1, wherein the first electrodes are anodes.
3. The method of claim 1, wherein the plurality of first electrodes and the plurality of fuses comprise the same material.
4. The method of claim 1, wherein the plurality of first electrodes and the plurality of fuses are defined simultaneously.

5. The method of claim 1, wherein the first conductive layer comprises a transparent conductive oxide.

\* \* \* \* \*